(12) United States Patent
Tambo et al.

(10) Patent No.: US 10,890,489 B2
(45) Date of Patent: Jan. 12, 2021

(54) INFRARED SENSOR AND PHONONIC CRYSTAL

(71) Applicant: Panasonic Intellectual Property Management Co., Ltd., Osaka (JP)

(72) Inventors: Naoki Tambo, Osaka (JP); Kouhei Takahashi, Osaka (JP); Takashi Kawasaki, Osaka (JP); Kunihiko Nakamura, Osaka (JP); Masaki Fujikane, Osaka (JP); Yasuyuki Naito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/566,868

(22) Filed: Sep. 10, 2019

(65) Prior Publication Data

US 2020/0003625 A1 Jan. 2, 2020

Related U.S. Application Data

(63) Continuation of application No. PCT/JP2019/002314, filed on Jan. 24, 2019.

(30) Foreign Application Priority Data

May 22, 2018 (JP) .................................. 2018-098175

(51) Int. Cl.
*G01J 5/08* (2006.01)
*G01J 5/02* (2006.01)
(Continued)

(52) U.S. Cl.
CPC ........... *G01J 5/0853* (2013.01); *G01J 5/0205* (2013.01); *G01J 5/14* (2013.01); *G01J 5/34* (2013.01)

(58) Field of Classification Search
CPC .......... G01J 5/0853; G01J 5/0205; G01J 5/14; G01J 5/34; G01J 5/20; G01J 5/12; G01J 5/024; H01L 35/32
See application file for complete search history.

(56) References Cited

U.S. PATENT DOCUMENTS 10,605,667 B2 * 3/2020 Kawasaki ............. G01J 5/0853
2009/0295505 A1 12/2009 Mohammadi et al.
(Continued)

FOREIGN PATENT DOCUMENTS

JP 2017-223644 12/2017

OTHER PUBLICATIONS

International Search Report of PCT application No. PCT/JP2019/002314 dated Apr. 23, 2019.
(Continued)

*Primary Examiner* — David P Porta
*Assistant Examiner* — Meenakshi S Sahu
(74) *Attorney, Agent, or Firm* — McDermott Will and Emery LLP

(57) ABSTRACT

An infrared sensor according to the present disclosure includes base substrate, infrared receiver, and beam. The beam includes connective portion connecting with the base substrate and/or a member on the base substrate, and separated portion separated from the base substrate. The infrared receiver and the beam are joined with each other at the separated portion. The infrared receiver is supported by the beam in a state where the infrared receiver is separated from the base substrate. The beam includes junction part joined to the infrared receiver, and section positioned between junction part and the connective portion, and section includes a phononic crystal structure defined by a plurality of through holes orderly arranged. The crystal structure includes a first domain and a second domain that are phononic crystal (Continued)

domains. The first domain includes, in a plan view, a plurality of through holes arranged orderly in a first direction, while the second domain includes, in a plan view, a plurality of through holes arranged orderly in a second direction that is different from the first direction. The infrared sensor according to the present disclosure has enhanced responsivity.

19 Claims, 17 Drawing Sheets

(51) Int. Cl.
*G01J 5/14* (2006.01)
*G01J 5/34* (2006.01)

(56) References Cited

U.S. PATENT DOCUMENTS

| | | |
|---|---|---|
| 2013/0214878 A1 | 8/2013 | Gorisse et al. |
| 2017/0047499 A1 | 2/2017 | Hussein |
| 2017/0069818 A1 | 3/2017 | Mitrovic et al. |
| 2017/0356806 A1 | 12/2017 | Takahashi et al. |

OTHER PUBLICATIONS

Rayisa P. Moiseyenko et al., "Phononic crystal diffraction gratings", Journal of Applied Physics 111, 034907 (2012), Feb. 10, 2012.
M. Nomura et al., "Impeded thermal transport in Si multiscale hierarchical architectures with phononic crystal nanostructures", Physical Review B 91, 205422 (2015), May 15, 2015.

\* cited by examiner

INFRARED SENSOR AND PHONONIC CRYSTAL

TECHNICAL FIELD

The present disclosure relates to an infrared sensor equipped with a beam that includes a phononic crystal structure. The present disclosure also relates to a phononic crystal having a phononic crystal structure.

BACKGROUND ART

A structure proposed in the field of infrared sensors is such that an infrared receiver is separated from a base substrate by means of a beam. This structure is intended for thermal insulation of the infrared receiver from the base substrate. As thermal insulation performance of the beam increases, infrared responsivity of an infrared sensor having this structure improves.

PTL 1, PTL 2, and NPL 1 each disclose a periodic structure that is defined by a plurality of through holes to decrease thermal conductivity of a thin film. In such a periodic structure, the through holes are orderly arranged in a plan view of the thin film with a periodicity of the order of nanometers (in a range of 1 nm to 1000 nm inclusive). This periodic structure is one type of phononic crystal structure. A phononic crystal structure of this type is a periodic structure that has, as unit lattices, minimum units forming an array of through holes. Thermal conductivity of a thin film can be reduced if, for example, the thin film is rendered porous. This is because voids introduced into the thin film to render the thin film porous reduce the thermal conductivity of the thin film. However, the phononic crystal structure can reduce thermal conductivity of a base material itself that composes the thin film. As such, an even further reduction in the thermal conductivity is expected in comparison to the mere act of rendering porous.

PTL 3 discloses an infrared sensor that uses a beam having a phononic crystal structure.

CITATION LIST

Patent Literature

PTL 1: U.S. Patent Application Publication No. 2017/0047499
PTL 2: U.S. Patent Application Publication No. 2017/0069818
PTL 3: Japanese Patent Application Publication No. 2017-223644

Non-Patent Literature

NPL 1: Nomura et al., "Impeded thermal transport is Si multiscale hierarchical architectures with phononic crystal nanostructures", Physical Review B 91, 205422 (2015)

SUMMARY

What is being called for is a technique that further enhances responsivity of an infrared sensor.

The present disclosure provides a technique that further enhances responsivity of an infrared sensor.

The present disclosure provides the following infrared sensor.

The infrared sensor includes:
a base substrate;
an infrared receiver; and
a beam,
wherein
the beam includes a connective portion connecting with of the base substrate and/or a member on the base substrate, and a separated portion separated from the base substrate,
the infrared receiver and the beam are joined with each other at the separated portion,
the infrared receiver is supported by the beam including the separated portion in a state where the infrared receiver is separated from the base substrate,
the beam includes a junction part joined to the infrared receiver, and a section positioned between the junction part and the connective portion includes a phononic crystal structure defined by a plurality of through holes orderly arranged,
the phononic crystal structure includes a first domain and a second domain that are phononic crystal domains,
the first domain includes, in a plan view, the plurality of through holes arranged orderly in a first direction,
the second domain includes, in a plan view, the plurality of through holes arranged orderly in a second direction that is different from the first direction,
the infrared receiver is a thermopile infrared receiver ora bolometer infrared receiver,
if the infrared receiver is the thermopile infrared receiver,
the beam includes a first region having a first Seebeck coefficient, a second region having a second Seebeck coefficient that is different from the first Seebeck coefficient, and a junction region in which the first region and the second region are joined with each other, and
the infrared receiver and the junction region of the beam are joined with each other, and
if the infrared receiver is the bolometer infrared receiver, the infrared sensor further includes:
a first wiring and a second wiring being both electrically connected to the infrared receiver;
a first signal processing circuit electrically connected to the first wiring; and
a second signal processing circuit electrically connected to the second wiring.

The beam included in the infrared sensor of the present disclosure has high thermal insulation performance. As such, the infrared sensor according to the present disclosure can have enhanced infrared responsivity.

DESCRIPTION OF EMBODIMENTS

KNOWLEDGE UNDERLYING THE PRESENT DISCLOSURE

Figure 1A:
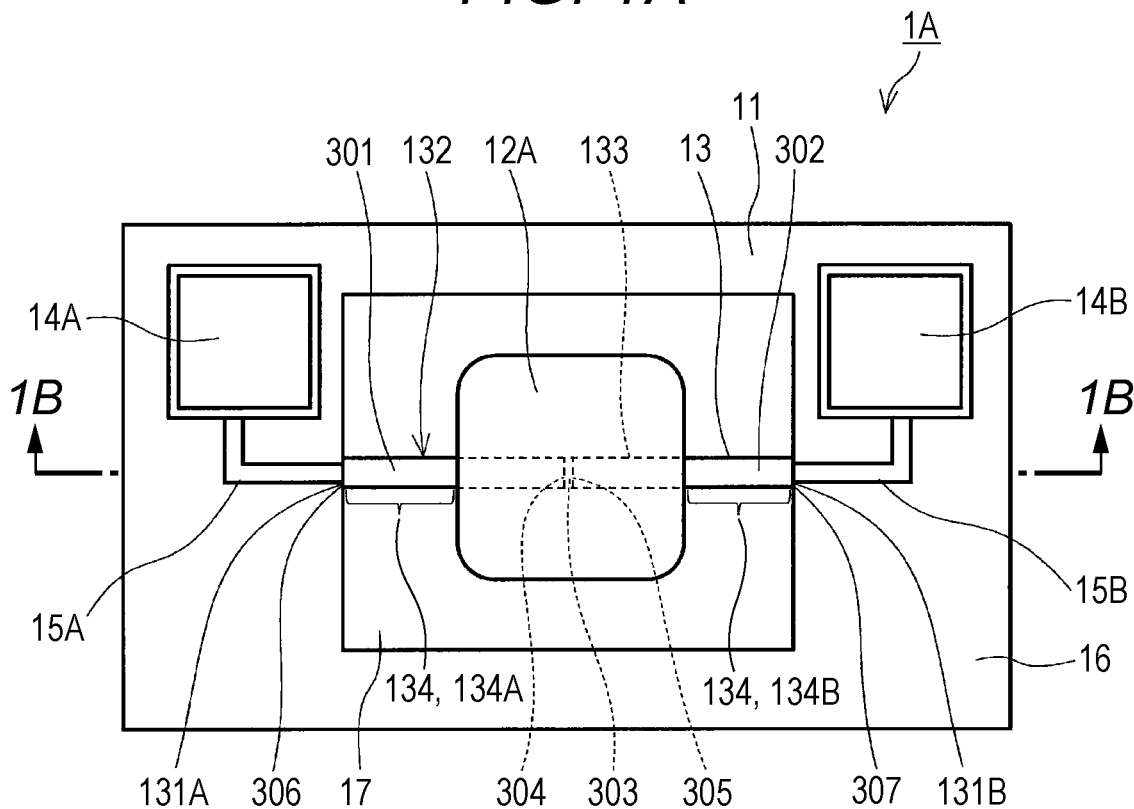
FIG. 1A is a plan view schematically illustrating an infrared sensor according to a first embodiment.

In insulators and semiconductors, heat is carried mainly by lattice vibrations called phonons. Thermal conductivity of a material composed of an insulator or a semiconductor is determined by a dispersion relation of phonons in the material. The dispersion relation of the phonons refers to a relation between frequency and wavenumber, or band structure. In the insulators and the semiconductors, the heat-carrying phonons span a wide frequency range of 100 GHz to 10 THz inclusive. This frequency band is a thermal band. The thermal conductivity of the material is determined by the dispersion relation of the phonons in the thermal band.

In the above-mentioned phononic crystal structure, a dispersion relation of phonons in the material can be controlled by the periodic structure defined by the through holes. In other words, the phononic crystal structure can control thermal conductivity of a material itself such as the base material for the thin film. The thermal conductivity of the material can be reduced substantially particularly by formation of a phononic band gap (PBG) that is effected by the phononic crystal structure. The phonons cannot exist in the PBG. As such, the PBG positioned in the thermal band can be a gap in thermal conduction. Even in a frequency band other than the PBG, a phononic dispersion curve has a small gradient due to the PBG. When the gradient is smaller, phonon group velocity and a thermal conductivity rate are reduced. These points significantly contribute to reduction of the thermal conductivity of the material.

According to examination conducted by the inventors, a degree of reduction in thermal conductivity that is effected by a phononic crystal structure is dependent on an angle formed by a direction of heat conduction and an orientation of a unit lattice of the phononic crystal structure. This is conceivably because elements that are associated with the thermal conductivity, such as a width of the PBG, a number of PBGs, and average phonon group velocity, are dependent on this angle. In terms of heat conduction, phonons macroscopically flow from higher temperature to lower temperature. On the other hand, when attention is paid to a microscopic area of the order of nanometers, no directivity is observed in the flow of the phonons. In other words, the phonons do not flow in a uniform direction on a microscopic level.

Members disclosed in the above-mentioned PTLs and NPL each include a plurality of phononic crystal domains having unit lattices of uniform orientation. When these members are viewed microscopically, interaction of phonons flowing in a certain direction is maximized, while interaction of phonons flowing in the other directions is weakened. On the other hand, a beam of an infrared sensor according to the present disclosure includes two or more phononic crystal domains of different unit lattice orientations. As such, when viewed microscopically, interaction of phonons flowing in a plurality of directions can be enhanced. This feature effects a further reduction in thermal conductivity of the beam which is a micro member, that is to say, a further improvement in thermal insulation performance.

EMBODIMENTS OF THE PRESENT DISCLOSURE

Embodiments of the present disclosure are hereinafter described with reference to the drawings. It is to be noted that the embodiments described below all show comprehensive or concrete examples. Those described in the following embodiments, including numerical values, shapes, materials, constituent elements, positions in which the constituent elements are disposed, a connection configuration of the constituent elements, process conditions, steps, and order of the steps, are examples and are not intended to be restrictive of the present disclosure. Among the constituent elements in the following embodiments, those constituent elements that are not described in independent claims each indicating the highest-order concept are described as optional. The drawings are schematic and are not necessarily exact illustrations.

First Embodiment

Figure 1B:
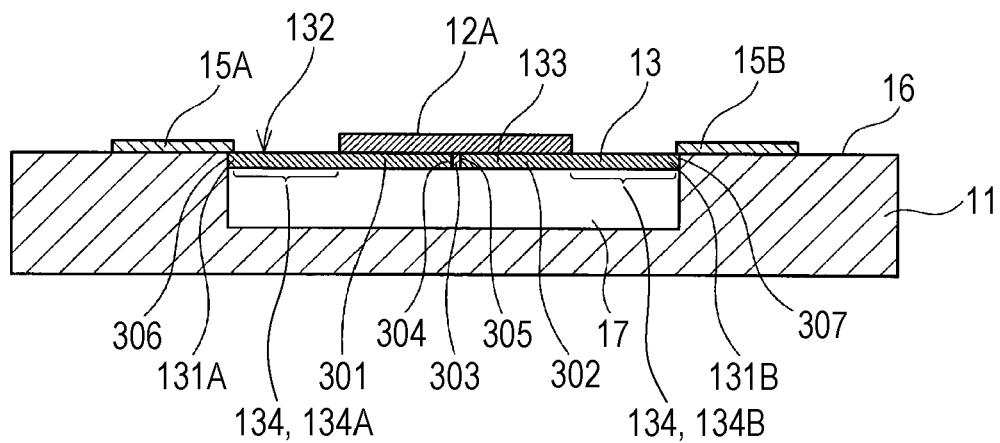
FIG. 1B illustrates section 1B-1B of the infrared sensor of FIG. 1A.

FIGS. 1A and 1B illustrate an infrared sensor according to the first embodiment. FIG. 1B illustrates section 1B-1B of infrared sensor 1A of FIG. 1A. Infrared sensor 1A of FIGS. 1A and 1B is a thermopile infrared sensor. Infrared sensor 1A includes base substrate 11, thermopile infrared receiver 12A, and beam 13. Infrared sensor 1A also includes first signal processing circuit 14A, second signal processing circuit 14B, first wiring 15A, and second wiring 15B. Signal processing circuits 14A and 14B and wirings 15A and 15B are provided on base substrate 11.

Beam 13 includes connective portions 131A and 131B connecting with base substrate 11, and separated portion 132 separated from base substrate 11. Beam 13 has those connective portions 131A and 131B at its both ends, respectively. Infrared receiver 12A and beam 13 are joined with each other at separated portion 132. Infrared receiver 12A is joined to an upper surface of beam 13. Infrared receiver 12A and beam 13 are joined with each other between the ends of beam 13, or more specifically, around a center of beam 13. Infrared receiver 12A is supported by beam 13 including separated portion 132 in a state where the infrared receiver 12A is separated from base substrate 11. Beam 13 is a double-supported beam.

Base substrate 11 includes recess 17 in upper surface 16 where infrared receiver 12A is provided. In a plan view, recess 17 has a larger area than infrared receiver 12A. In the plan view, infrared receiver 12A is surrounded by an outer edge of recess 17. Recess 17 is positioned between base substrate 11 and infrared receiver 12A with beam 13. In a sectional view, infrared receiver 12A and beam 13 are suspended above recess 17 of base substrate 11. The ends of beam 13 are both connected to a side wall of recess 17. In this specification, the "plan view" refers to a view of an object as seen in a direction perpendicular to a principal surface of the object. The "principal surface" refers to a largest area surface.

Beam 13 is a single layer. Beam 13 includes first region 301 having a first Seebeck coefficient, second region 302 having a second Seebeck coefficient that is different from the first Seebeck coefficient, and junction region 303 in which first region 301 and second region 302 are joined with each other. First region 301 and second region 302 are joined with each other at their respective one ends 304 and 305. First and second regions 301 and 302 joined each other by junction region 303 compose a thermocouple element. In the plan view, junction region 303 is positioned to be overlapped by infrared sensor 1A. In the plan view, junction region 303 is positioned, for example, in a center of infrared sensor 1A. Infrared receiver 12A and junction region 303 of beam 13 are joined with each other. A difference between the first Seebeck coefficient and the second Seebeck coefficient is, for example, equal to or more than 10 μV/K. The Seebeck coefficients in this specification respectively refer to values at 25° C.

First wiring 15A is electrically connected to first region 301 at another end 306 of first region 301. End 306 is positioned at connective portion 131A of beam 13. Second wiring 15B is electrically connected to second region 302 at another end 307 of second region 302. End 307 is positioned at connective portion 131B of beam 13. First wiring 15A electrically connects first region 301 of beam 13 and first signal processing circuit 14A. Second wiring 15B electrically connects second region 302 of beam 13 and second signal processing circuit 14B. In FIGS. 1A and 1B, first signal processing circuit 14A and second signal processing circuit 14B are two members independent of each other. However, first signal processing circuit 14A and second signal processing circuit 14B may be integrated into one member.

Beam 13 includes junction part 133 joined to infrared receiver 12A, and sections 134 (134A and 134B) each positioned between junction part 133 and connective portion 131A or 131B that connects with base substrate 11 and first or second wiring 15A or 15B. Sections 134 (134A and 134B) each include phononic crystal structure A. If beam 13 includes a plurality of sections 134, phononic crystal structure A is included, for example, in every one of the sections.

When infrared light is incident on infrared receiver 12A, infrared receiver 12A experiences temperature increase. The temperature increase that infrared receiver 12A experiences here becomes greater with increasing thermal insulation from base substrate 11 which is a heat bath as well as from those members on base substrate 11. Associated with the temperature increase, electromotive force is caused by the Seebeck effect to the thermocouple element that is joined to thermopile infrared receiver 12A. The resulting electromotive force is processed by signal processing circuits 14A and 14B, whereby the infrared light is detected. Depending on signal processing, infrared sensor 1A is capable of infrared intensity measurement and/or object temperature measurement.

First region 301 is composed of a first material having the first Seebeck coefficient. Second region 302 is composed of a second material having the second Seebeck coefficient that is different from the first Seebeck coefficient. Instead of being metals, the first material and the second material may be semiconductors or insulators. This is because a medium that carries heat in metal is not phonons, but mainly free electrons. Examples of the semiconductors include a semiconductor made of a single element such as Si or Ge, a compound semiconductor such as SiN, SiC, SiGe, GaAs, InAs, InSb, InP, GaN, or AlN, and an oxide semiconductor such as $Fe_2O_3$, $VO_2$, $TiO_2$, or $SrTiO_3$. The semiconductors that are respectively the first material and the second material are not limited to these examples. The first material and the second material normally have different compositions. However, the first material and the second material that are the semiconductors can have the same basic composition if their respective conduction types are different. The semiconductor conduction type can be controlled by a publicly known technique such as doping. The first material and the second material may be, for example, a p-type semiconductor and an n-type semiconductor, respectively. In that case, first region 301 is a p-type region, while second region 302 is an n-type region. In one concrete example, single-layer beam 13 composed of single-crystal Si includes doped first region 301 and doped second region 302. A process of processing the single-crystal Si is established. As such, this example has excellent manufacturability.

Each of the first material and the second material may be a single-crystal material in which atomic arrangement has long-range order or may be a polycrystalline material or an amorphous material.

Base substrate 11 is typically composed of a semiconductor. The semiconductor is, for example, Si. Upper surface 16 of base substrate 11 composed of Si may be formed with an oxide film. The oxide film is, for example, a $SiO_2$ film. However, the composition of base substrate 11 is not limited to the above examples.

Infrared receiver 12A is composed of, for example, a silicon-based semiconductor. The silicon-based semiconductor is, for example, Si or SiGe. However, the composition of infrared receiver 12A is not limited to the above examples.

Wirings 15A and 15B are each composed of a doped semiconductor or a metal. The metal is, for example, of a low thermal conductivity type such as Ti or TiN. However, the composition of each of wirings 15A and 15B is not limited to the above examples.

Signal processing circuits 14A and 14B each can have a publicly known configuration.

A description is hereinafter provided of phononic crystal structure A of beam 13. Beam 13 may include phononic crystal structure A outside sections 134A and 134B.

Figure 2:
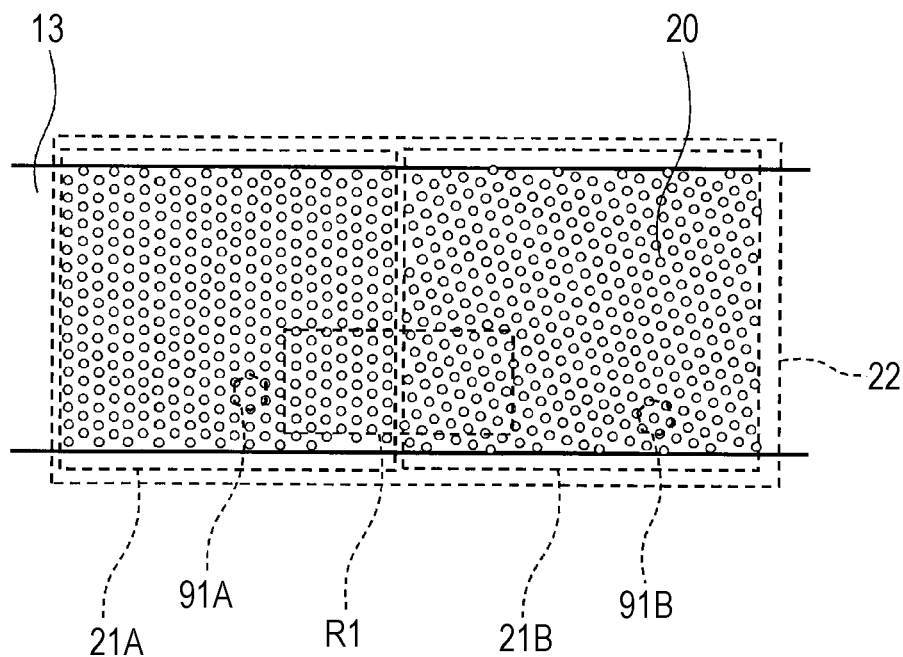
FIG. 2 is a plan view schematically illustrating an example of a phononic crystal structure that a beam of an infrared sensor according to the present disclosure includes.

An example of phononic crystal structure A is illustrated in FIG. 2. FIG. 2 illustrates a plan view of a portion of beam 13. Beam 13 is, for example, a thin film having a thickness ranging from 10 nm to 500 nm inclusive. In a plan view, beam 13 is rectangular. Long sides of beam 13 correspond with a direction connecting infrared receiver 12A and first or second wiring 15A or 15B, that is to say, a direction of macro heat conduction in infrared sensor 1A. Beam 13 is provided with a plurality of through holes 20 extending in a direction along the thickness of beam 13. Phononic crystal structure A of beam 13 is a two-dimensional phononic crystal structure in which the plurality of through holes 20 are arranged orderly in an in-plane direction.

Phononic crystal structure A includes first domain 21A and second domain 21B that are phononic crystal domains, respectively. In a plan view, first domain 21A includes a phononic single-crystal structure defined by a plurality of through holes 20 orderly arranged in a first direction. In the plan view, second domain 21B includes a phononic single-crystal structure defined by a plurality of through holes 20 orderly arranged in a second direction that is different from the first direction. In each of these single-crystal structures, the plurality of through holes 20 are of the same diameter and are arranged with the same periodicity. In each of these single-crystal structures, unit lattices 91A or 91B formed by the orderly arranged plurality of through holes 20 have the same orientation. In the plan view, each of first and second domains 21A and 21B is of a rectangular shape. In the plan view, first domain 21A and second domain 21B are of the same shape. Phononic crystal structure A is also phononic polycrystalline structure 22 that is a composite of the plurality of phononic single-crystal structures.

Being the phononic crystal domain, the domain has an area that is, for example, equal to or more than 25 $P^2$ in the plan view with through holes 20 arranged with periodicity P. In order for the phononic crystal structure to control a dispersion relation of phonons, at least the area of the domain may be equal to or more than 25 $P^2$. For a square domain, with a periodicity that is equal to or more than 5×P, an area equal to or more than 25 $P^2$ can be secured in a plan view.

Figure 3A:
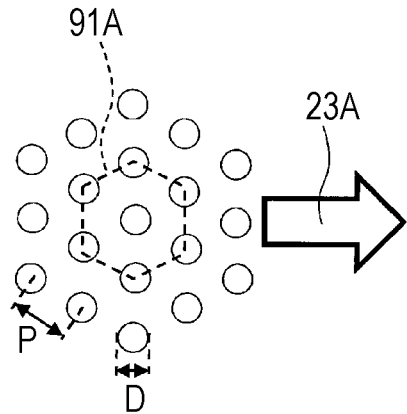
FIG. 3A schematically illustrates a unit lattice and its orientation in a first domain included in the FIG. 2 phononic crystal structure.
Figure 3B:
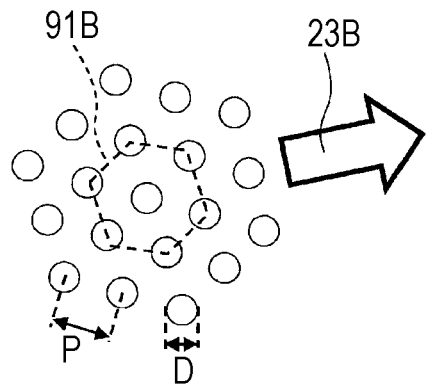
FIG. 3B schematically illustrates a unit lattice and its orientation in a second domain included in the phononic crystal structure of FIG. 2.

Phononic crystal structure A is such that as illustrated in FIGS. 3A and 3B, orientation 23A of unit lattice 91A in first domain 21A is different in the plan view from orientation 23B of unit lattice 91B in second domain 21B. An angle formed by orientation 23A and orientation 23B is, for example, equal to or more than 10 degrees in the plan view. However, if unit lattice 91A and unit lattice 91B are the same and have n-fold rotational symmetry, an upper limit of the angle formed by orientation 23A and orientation 23B is less than 360/n degrees. When a unit lattice has n-fold rotational symmetry where n is a plural number, n used for determining the upper limit of the above angle is a largest number. A hexagonal lattice, for example, has two-fold rotational symmetry, three-fold rotational symmetry, and six-fold rotational symmetry. To determine the upper limit of the angle, "6" is used here. This means that for unit lattices 91A and 91B that are hexagonal lattices, the angle formed by orientation 23A and orientation 23B is less than 60 degrees. Phononic crystal structure A includes at least two or more phononic crystal domains of different unit lattice orientations. As long as this condition is met, phononic crystal structure A may also include at least one of any phononic crystal domain or a domain having no phononic crystal structure.

Phononic crystal structure A including a smaller number of domains each having no phononic crystal structure is a preferable configuration. A reason for this is that the larger the number of domains each having a phononic crystal structure, the more enhanced the thermal insulation performance of phononic crystal structure A, that is to say, the more increased the responsivity of an infrared sensor. Another reason is because temperature difference increases between infrared receiver 12A and base substrate 11. Not only infrared receiver 12A but also beam 13 receives infrared light. If phononic crystal structure A abounds with domains each having no phononic crystal structure, beam 13 has a large infrared receiving area. Accordingly, beam 13 receives a large amount of infrared light in this case. This leads to a small temperature difference between infrared receiver 12A and base substrate 11. On the other hand, if phononic crystal structure A abounds with domains each having the phononic crystal structure, beam 13 receives a small amount of infrared light. As such, a larger temperature difference can be maintained between infrared receiver 12 and base substrate 12. Consequently, an infrared sensor has increased responsivity.

The unit lattice orientation can be determined based on any rule. However, the same rule needs to be applied to those different domains to determine the unit lattice orientation. In one example, the unit lattice orientation corresponds with a direction in which average phonon group velocity becomes the lowest when one direction is determined as being the direction of macro heat conduction in phononic crystal structure A. In another example, the unit lattice orientation corresponds with an extending direction of a straight line bisecting an angle formed by two nonparallel sides of the unit lattice. However, the same rule needs to be applied to those different domains to determine those two sides. In yet another example, the unit lattice orientation corresponds with a direction along a straight line connecting two holes closest to each other.

Figure 4:
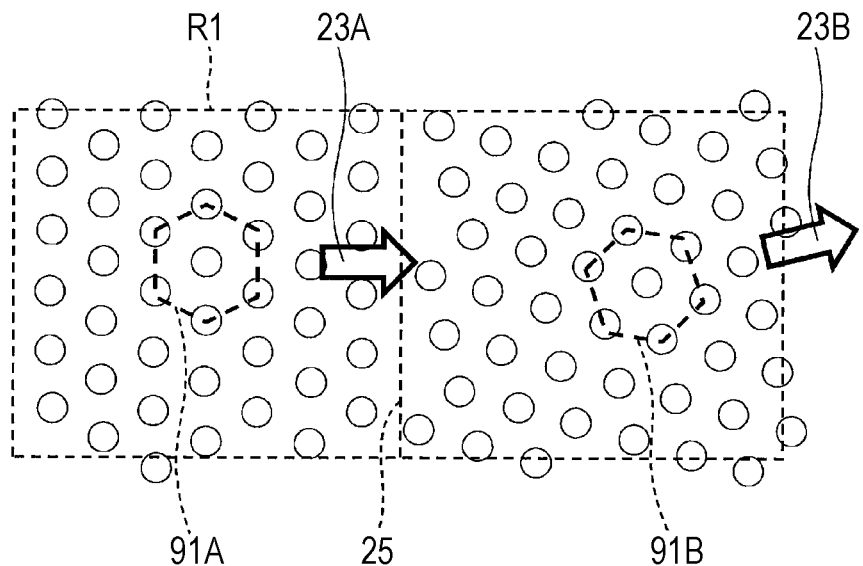
FIG. 4 is an enlarged view of area R1 of the phononic crystal structure of FIG. 2.

FIG. 4 is an enlarged view of area R1 of phononic crystal structure A of FIG. 2. There is a change of orientations 23A and 23B of unit lattices 91A and 91B at interface 25 between first and second domains 21A and 21B that are adjacent to each other. Interface 25 where the change of unit lattice orientations takes place causes a large interfacial resistance to a macro heat flow in phononic crystal structure A. This interfacial resistance is based on a phonon group velocity mismatch between first domain 21A and second domain 21B. This interfacial resistance contributes to reduction of thermal conductivity of beam 13 including phononic crystal structures A. In FIG. 4, interface 25 extends linearly in a plan view. In the plan view, interface 25 extends in a direction along a width of rectangular beam 13. The direction along the width can be a direction perpendicular to an extending direction of beam 13 center line determined by the direction of macro heat conduction. In the plan view, interface 25 divides phononic crystal structure A perpendicularly to the direction of macro heat conduction.

In phononic crystal structure A of FIG. 2, periodicity P with which the plurality of through holes 20 are arranged in first domain 21A is equal to periodicity P with which the plurality of through holes 20 are arranged in second domain 21B.

In phononic crystal structure A of FIG. 2, the plurality of through holes 20 orderly arranged in first domain 21A are equal in diameter to the plurality of through holes 20 orderly arranged in second domain 21B.

In phononic crystal structure A of FIG. 2, unit lattice 91A of first domain 21A and unit lattice 91B of second domain 21B are of the same type. In FIG. 2, unit lattice 91A and unit lattice 91B are both hexagonal lattices.

The shape of each of the domains in the plan view is not limiting. Examples of the shape of each of the domains in the plan view include polygons that include a triangle, a square, and a rectangle, a circle, an ellipse, and a shape resulting from a combination of these. The shape of each of the domains in the plan view may even be amorphous. The number of domains included in phononic crystal structure A is not limiting. As the number of domains increases in phononic crystal structure A, interfacial resistance that is effected by interdomain interfaces increases. The size of each of the domains included in phononic crystal structure A is also not limiting.

If the plurality of sections 134 of beam 13 each include phononic crystal structure A, those phononic crystal structures A specifically may be identical or different.

Examples of phononic crystal structure A are hereinafter given.

Figure 5:
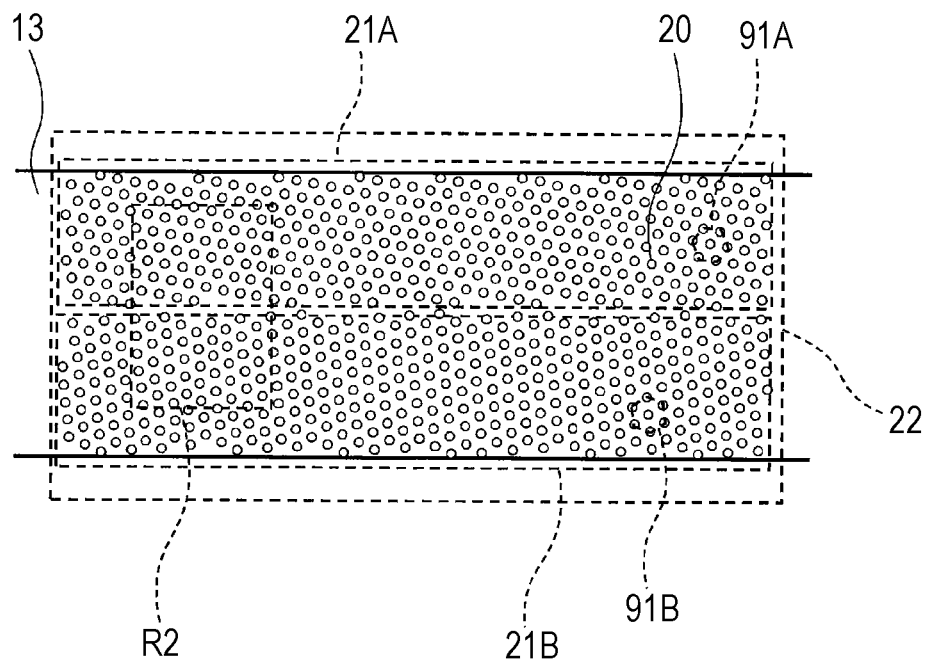
FIG. 5 is a plan view schematically illustrating another example of the phononic crystal structure that a beam of an infrared sensor according to the present disclosure includes.
Figure 6:
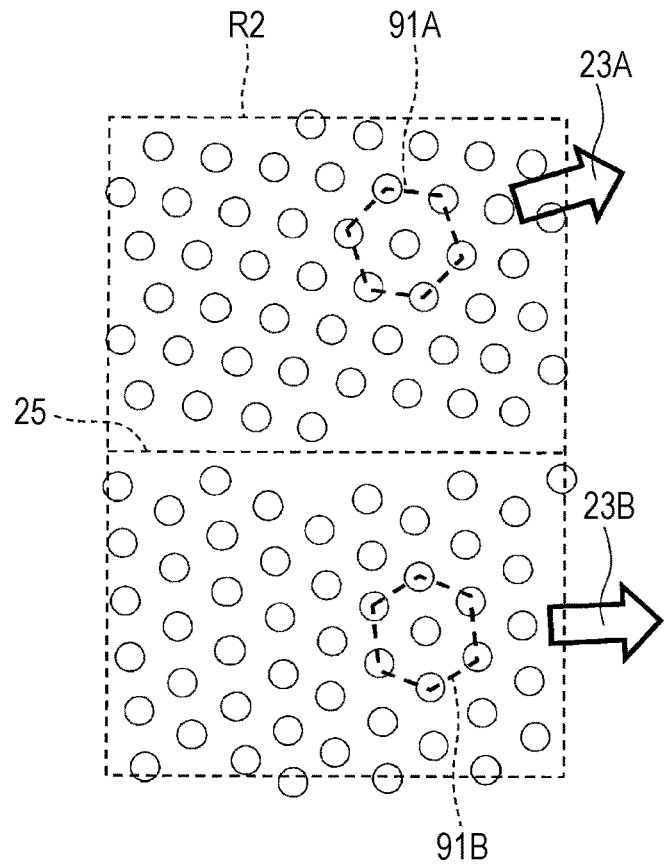
FIG. 6 is an enlarged view of area R2 of the phononic crystal structure of FIG. 5.

In FIGS. 5 and 6, polycrystalline structure 22 that is phononic crystal structure A includes, between first and second domains 21A and 21B that are adjacent to each other in a plan view, interface 25 extending in a direction along long sides of rectangular beam 13. The direction along the long sides can be a direction of macro heat conduction. In FIGS. 5 and 6, phononic crystal structure A is otherwise structurally similar to phononic crystal structure A of FIG. 2. In the plan view, interface 25 divides phononic crystal structure A in parallel to the direction of macro heat conduction. FIG. 6 is an enlarged view of area R2 illustrated in FIG. 5.

In each of FIG. 2 and FIG. 5 phononic crystal structures A, first domain 21A and second domain 21B are of the same size in the plan view. However, first domain 21A and second domain 21B of phononic structure A may be different in size in a plan view.

Figure 7:
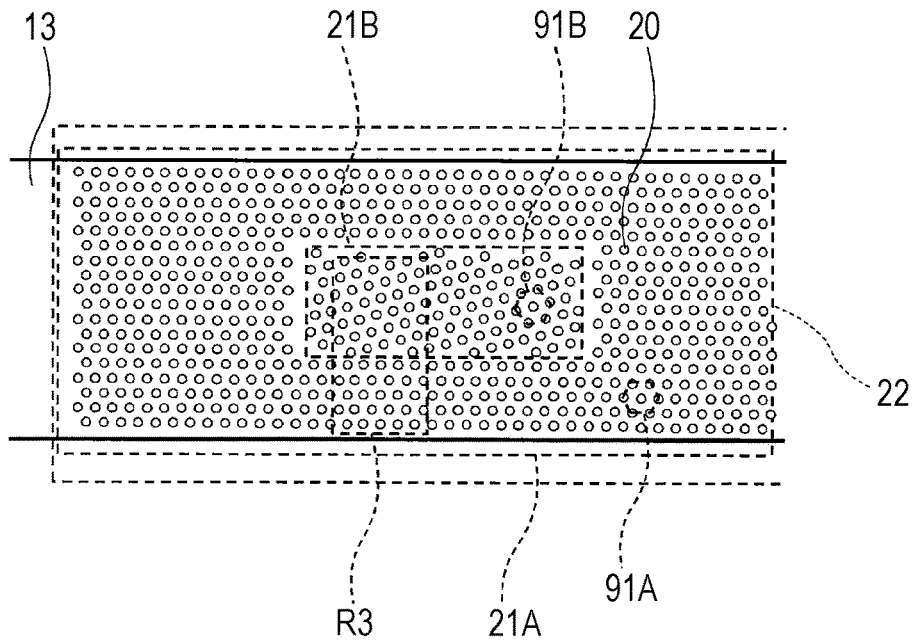
FIG. 7 is a plan view schematically illustrating yet another example of the phononic crystal structure that a beam of an infrared sensor according to the present disclosure includes.
Figure 8:
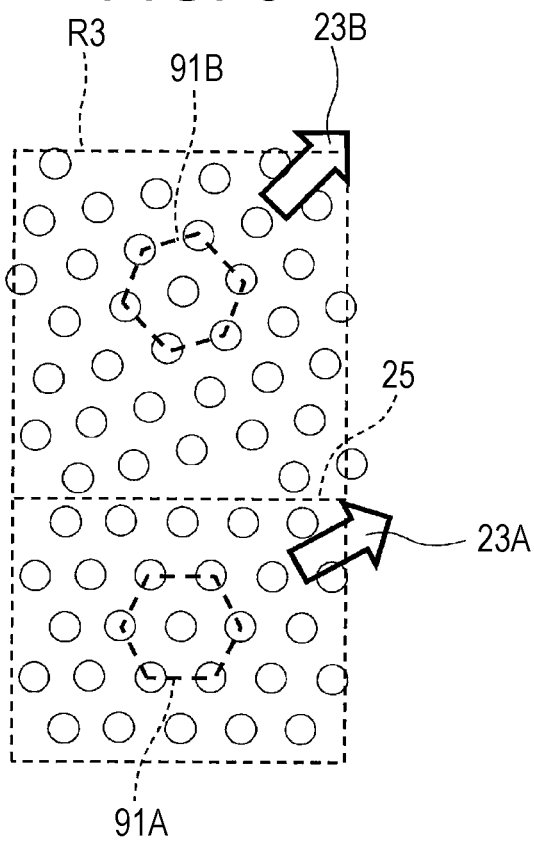
FIG. 8 is an enlarged view of area R3 of the phononic crystal structure of FIG. 7.

In FIGS. 7 and 8, polycrystalline structure 22 that is phononic crystal structure A includes second domain 21B surrounded by first domain 21A in a plan view. In the plan view, each of first and second domains 21A and 21B is of a rectangular shape. However, first domain 21A and second domain 21B are different in size in the plan view. In the plan view, interface 25 between second domain 21B and first domain 21A surrounding second domain 21B defines an outer edge of second domain 21B. In FIGS. 7 and 8, phononic crystal structure A is otherwise structurally similar to FIG. 2 phononic crystal structure A. FIG. 8 is an enlarged view of area R3 illustrated in FIG. 7.

In FIGS. 7 and 8, interface 25 of phononic crystal structure A includes bends.

In FIGS. 7 and 8, second domain 21B of phononic crystal structure A does not border sides of beam 13.

Figure 9:
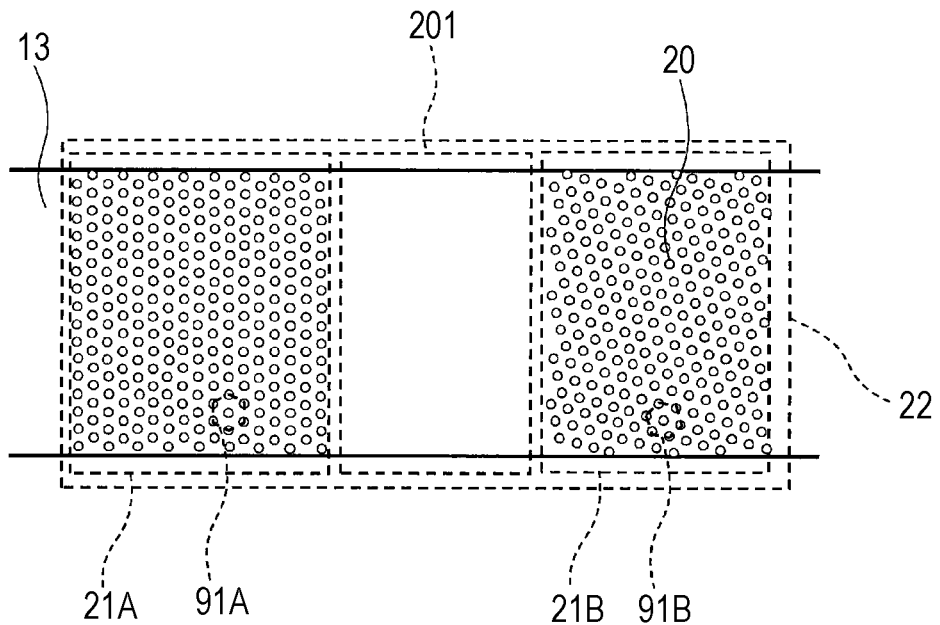
FIG. 9 is a plan view schematically illustrating still yet another example of the phononic crystal structure that a beam of an infrared sensor according to the present disclosure includes.

In FIG. 9, polycrystalline structure 22 that is phononic crystal structure A includes first domain 21A and second domain 21B that are in spaced relationship in a plan view. More specifically, domain 201 having no through holes 20 is provided, in the plan view, between first domain 21A and second domain 21B in a direction along long sides of beam 13. In FIG. 9, phononic crystal structure A is otherwise structurally similar to phononic crystal structure A of FIG. 2.

Figure 10:
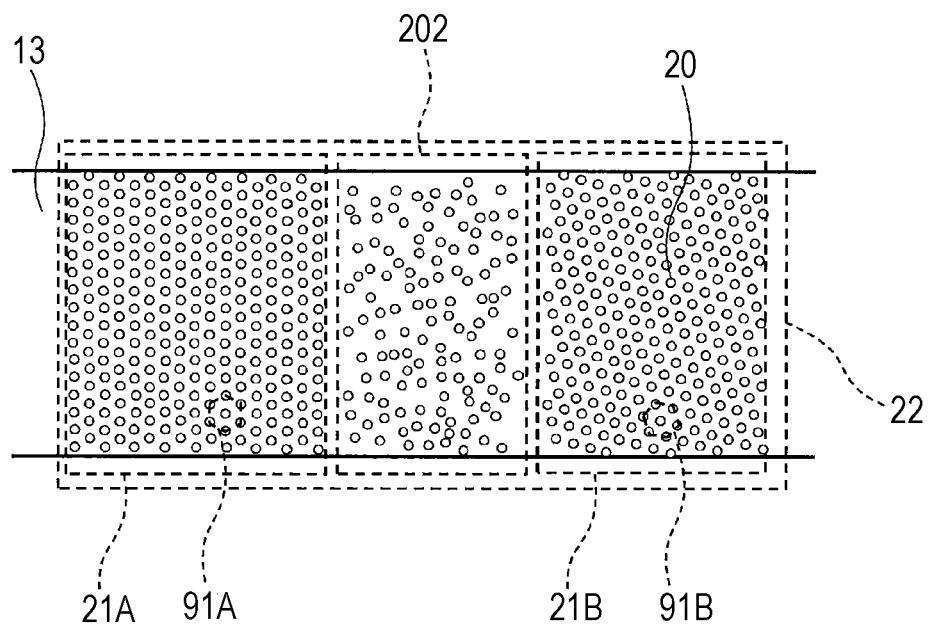
FIG. 10 is a plan view schematically illustrating a different example of the phononic crystal structure from the above that a beam of an infrared sensor according to the present disclosure includes.

In FIG. 10, polycrystalline structure 22 that is phononic crystal structure A includes first domain 21A and second domain 21B that are in spaced relationship in a plan view. More specifically, domain 202 including randomly provided through holes 20 is provided, in the plan view, between first domain 21A and second domain 21B in a direction along long sides of beam 13. In the plan view, through holes 20 are not arranged orderly in domain 202. Alternatively, an area occupied by an orderly arrangement within domain 202 has an area of, for example, less than 25 $P^2$ in the plan view. It is to be noted here that P is a periodicity with which through holes 20 are arranged. In FIG. 10, phononic crystal structure A is otherwise structurally similar to phononic crystal structure A of FIG. 2.

Figure 11:
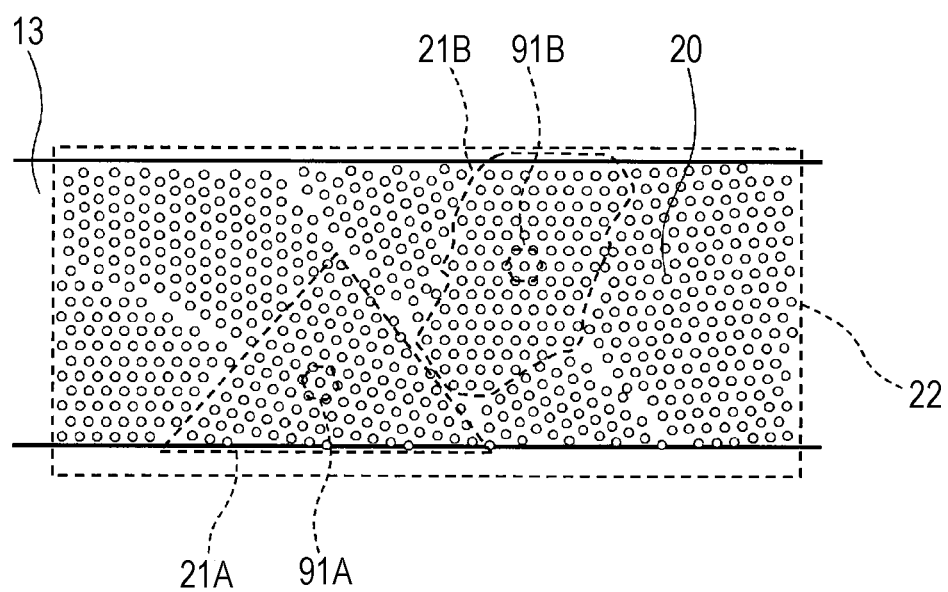
FIG. 11 is a plan view schematically illustrating a different example of the phononic crystal structure from the above that a beam of an infrared sensor according to the present disclosure includes.

In FIG. 11, polycrystalline structure 22 that is phononic crystal structure A includes a plurality of domains 21A to 21G of different shapes in a plan view. In each of the domains, a plurality of through holes 20 are arranged with the same periodicity, and unit lattices have the same orientation. However, the unit lattice orientations differ among domains 21A to 21G. In the plan view, domains 21A to 21G are different in size and shape. Compared with the configurations exemplified thus far, this configuration includes more unit lattice orientations when phononic crystal structure A is viewed in its entirety. As such, a thermal conductivity reduction effect is more significant on the basis of the unit lattice orientations differing among the domains. In this configuration, interdomain interfaces 25 extend in a plurality of random directions in the plan view. As such, the thermal conductivity reduction effect is even more significant on the basis of interfacial resistances.

In FIG. 11 phononic crystal structure A, interface 25 between first and second domains 21A and 21B that are adjacent to each other extends in a direction inclined relative to a direction along a width of beam 13 in the plan view. Interface 25 also includes bends in the plan view.

Figure 12A:
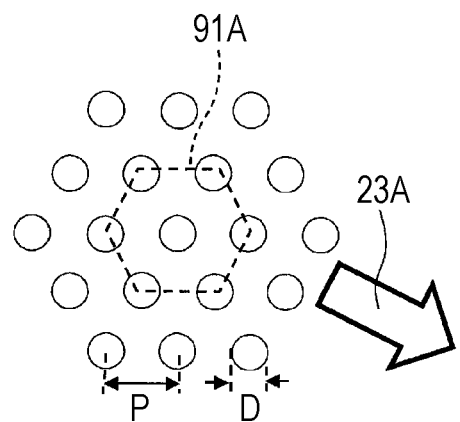
FIG. 12A schematically illustrates an example of a unit lattice of the phononic crystal structure that a beam of an infrared sensor according to the present disclosure includes.
Figure 12B:
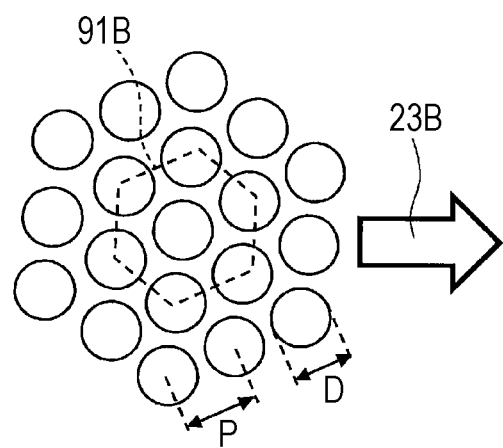
FIG. 12B schematically illustrates another example of the unit lattice of the phononic crystal structure that the beam of the infrared sensor according to the present disclosure includes.

Polycrystalline structure 22 that is phononic crystal structure A may include first domain 21A and second domain 21B that have different periodicities P with which through holes 20 are arranged and/or different diameters D of through holes 20. First domain 21A illustrated in FIG. 12A has diameter D of through hole 20 that is different from diameter D of through hole 20 in second domain 21B illustrated in FIG. 12B. It is to be noted that periodicity P with which through holes 20 are arranged in first domain 21A illustrated in FIG. 12A is the same as periodicity P with which through holes 20 are arranged in second domain 21B illustrated in FIG. 12B.

Figure 13:
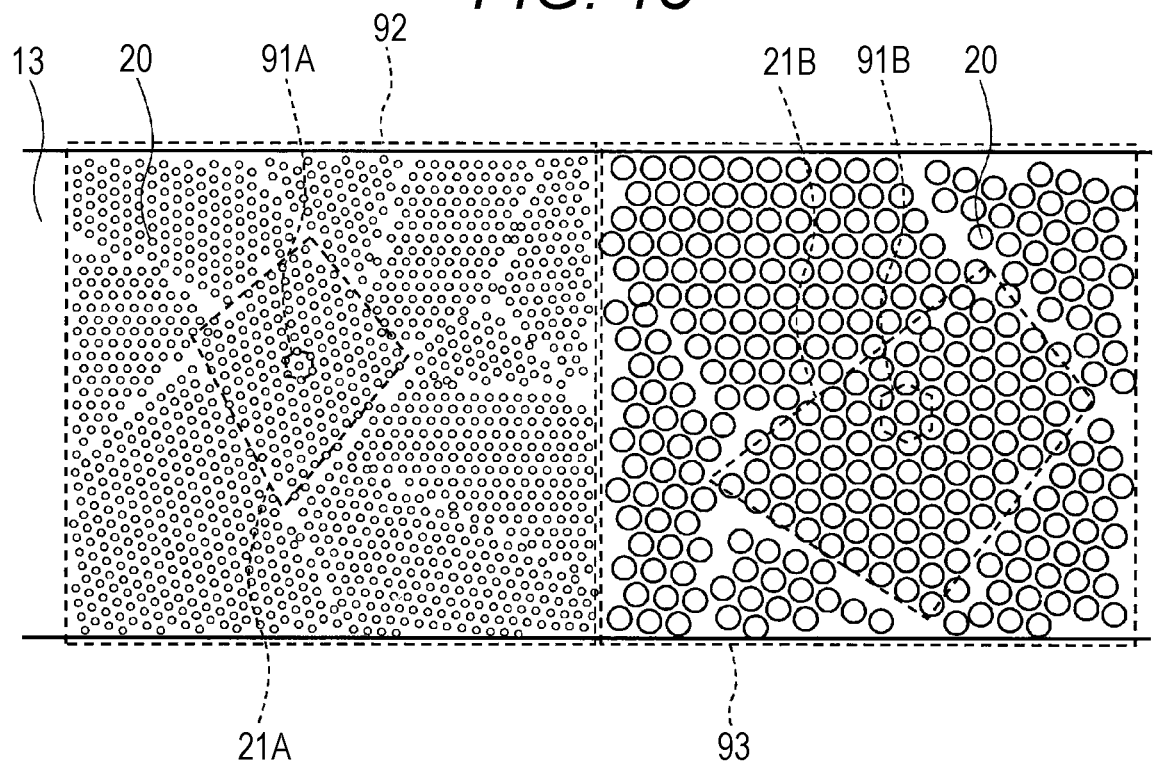
FIG. 13 is a plan view schematically illustrating a different example of the phononic crystal structure from the above that a beam of an infrared sensor according to the present disclosure includes.

Phononic crystal structure A illustrated in FIG. 13 includes first domain 21A in which a plurality of through holes 20 of relatively small diameter D are arranged orderly with relatively small periodicity P, and second domain 21B in which a plurality of through holes 20 of relatively large diameter D are arranged orderly with relatively large periodicity P. Phononic crystal structure A illustrated in FIG. 13 includes area 92 including through holes 20 that are of relatively small diameter D and have relatively small periodicity P, and area 93 including through holes 20 that are of relatively large diameter D and have relatively large periodicity P. Areas 92 and 93 border each other. In a plan view, areas 92 and 93 each include a plurality of domains that are different in shape and unit lattice orientation as in the FIG. 11 example. Phononic crystal structure A is divided perpendicularly to a direction of macro heat conduction into these areas 92 and 93. In this configuration, a phononic band gap formed by first domain 21A and a phononic band gap formed by second domain 21B have different frequency bands, so that a thermal conductivity reduction effect is particularly significant.

Figure 14:
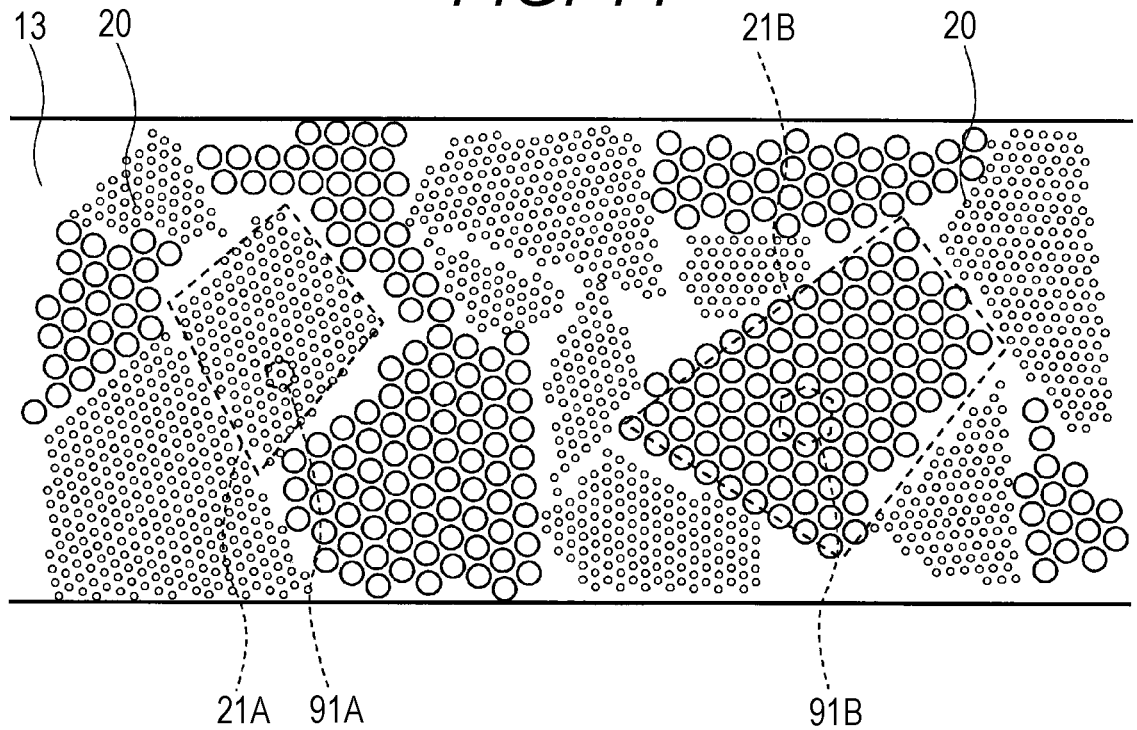
FIG. 14 is a plan view schematically illustrating a different example of the phononic crystal structure from the above that a beam of an infrared sensor according to the present disclosure includes.

Phononic crystal structure A illustrated in FIG. 14 includes first domain 21A in which a plurality of through holes 20 of relatively small diameter D are arranged orderly with relatively small periodicity P, and second domain 21B in which a plurality of through holes 20 of relatively large diameter D are arranged orderly with relatively large periodicity P. In a plan view, phononic crystal structure A of FIG. 14 includes a plurality of domains that are different in shape and unit lattice orientation. In this configuration, a phononic band gap formed by first domain 21A and a phononic band gap formed by second domain 21B have different frequency bands, so that a thermal conductivity reduction effect is particularly significant.

Periodicity P with which through holes 20 are arranged ranges, for example, from not less than 1 nm and not more than 300 nm. This is because a wavelength of heat-carrying phonons ranges mainly from not less than 1 nm and not more than 300 nm. Periodicity P is determined by a center-to-center distance between through holes 20 that are adjacent to each other in a plan view (refer to FIGS. 12A and 12B).

Diameter D of through hole 20 is expressed relative to periodicity P in terms of ratio D/P and is, for example, D/P≥0.5. Ratio D/P<0.5 leads to an extremely small percentage of voids in beam 13, so that there can be no sufficient reduction in thermal conductivity. An upper limit of ratio D/P is, for example, less than 0.9 to prevent contact between adjacent through holes 20. Diameter D is an opening diameter of through hole 20. If through hole 20 has a circular opening shape in a plan view, diameter D is a diameter of that circle. Through hole 20 need not have a circular opening shape in the plan view. In that case, diameter D is determined by a diameter of an imaginary circle having the same area as an opening area (refer to FIGS. 12A and 12B).

Figure 15A:
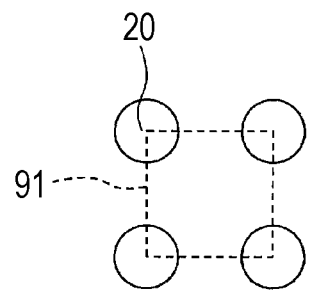
FIG. 15A schematically illustrates an example of the unit lattice of the phononic crystal structure that a beam of an infrared sensor according to the present disclosure includes.
Figure 15B:
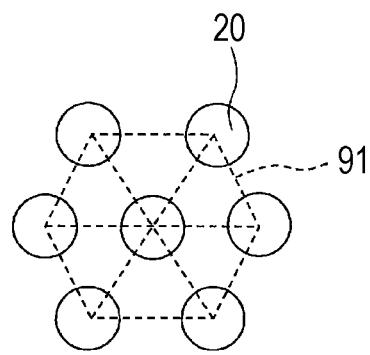
FIG. 15B schematically illustrates another example of the unit lattice of the phononic crystal structure that a beam of an infrared sensor according to the present disclosure includes.
Figure 15C:
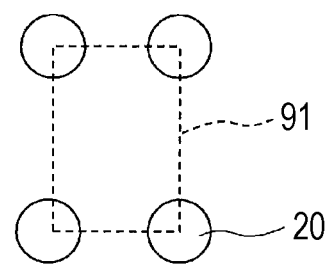
FIG. 15C schematically illustrates yet another example of the unit lattice of the phononic crystal structure that a beam of an infrared sensor according to the present disclosure includes.
Figure 15D:
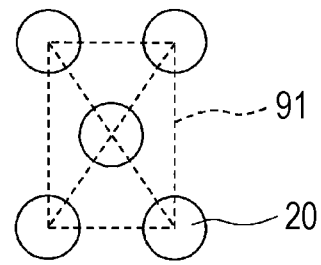
FIG. 15D schematically illustrates a different example of the unit lattice from the above of the phononic crystal structure that a beam of an infrared sensor according to the present disclosure includes.

Examples of a type of unit lattice 91 formed by orderly arranged through holes 20 include a square lattice (FIG. 15A), a hexagonal lattice (FIG. 15B), a rectangular lattice (FIG. 15C), and a face-centered rectangular lattice (FIG. 15D). However, the type of unit lattice 91 is not limited to these examples.

A description is hereinafter provided of an example of a method for manufacturing infrared sensor 1A of the first embodiment. Infrared sensor 1A of FIG. 1A is manufactured according to the method described below. FIGS. 16A to 16E used in the following description respectively illustrate sections corresponding to section 1B-1B of infrared sensor 1A of FIG. 1A. The method for manufacturing infrared sensor 1A is not limited to the following example.

Figure 16A:
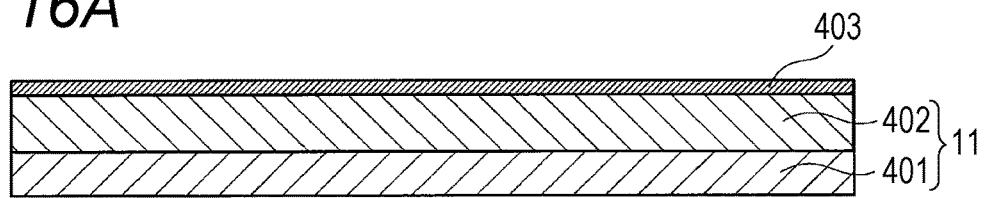
FIG. 16A is a sectional view schematically illustrating an example of a method for manufacturing the infrared sensor of the first embodiment.

Si substrate 401 is prepared first. Next, insulating film 402 composed of SiO$_2$ is formed by thermal oxidation of an upper surface of Si substrate 401. In this way, base substrate 11 is obtained. Next, beam layer 403 is formed on an upper surface of insulating film 402 (FIG. 16A). Beam layer 403 can be formed by, for example, a publicly known thin film formation technique such as chemical vapor deposition (CVD). A material selected for beam layer 403 is a material with which beam 13, first region 301, and second region 302 can be formed. The material for beam layer 403 is, for example, a material that changes into first region 301 and second region 302 by undergoing doping. The material selected for beam layer 403 may be a material with which even infrared receiver 12A can be formed. Beam layer 403 has a thickness ranging, for example, from not less than 10 nm and not more than 500 nm.

Figure 16B:
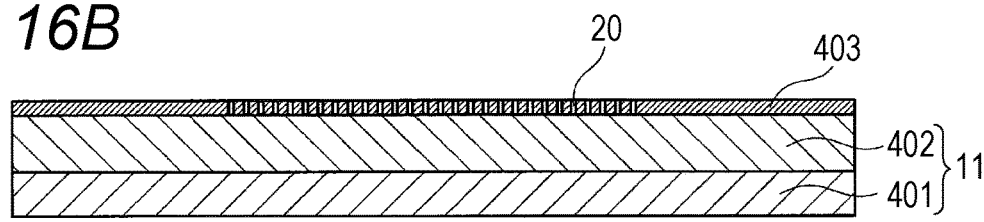
FIG. 16B is a sectional view schematically illustrating the example of the method for manufacturing the infrared sensor of the first embodiment.

Next, as illustrated in FIG. 16B, the plurality of through holes 20 are formed in beam layer 403 to be arranged orderly in a plan view. Electron beam lithography, for example, can be used for forming through holes 20 with periodicity P approximately ranging from 100 nm to 300 nm inclusive. Block copolymer lithography can be used for forming through holes 20 with periodicity P approximately ranging from not less than 1 nm and not more than 100 nm. The block copolymer lithography is suitable for formation of phononic crystal structure A that includes a plurality of domains of different shapes in a plan view, such as phononic crystal structure A illustrated in FIG. 11.

Figure 16C:
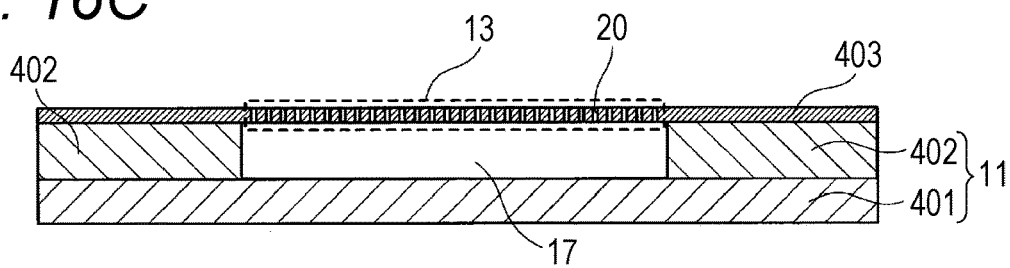
FIG. 16C is a sectional view schematically illustrating the example of the method for manufacturing the infrared sensor of the first embodiment.

Next, beam layer 403 and insulating film 402 undergo photolithography and selective etching, whereby the shape of beam 13 and recess 17 are formed as illustrated in FIG. 16C. When recess 17 is formed, the part changed into the above-mentioned shape in beam layer 403 becomes separate from base substrate 11.

Figure 16D:
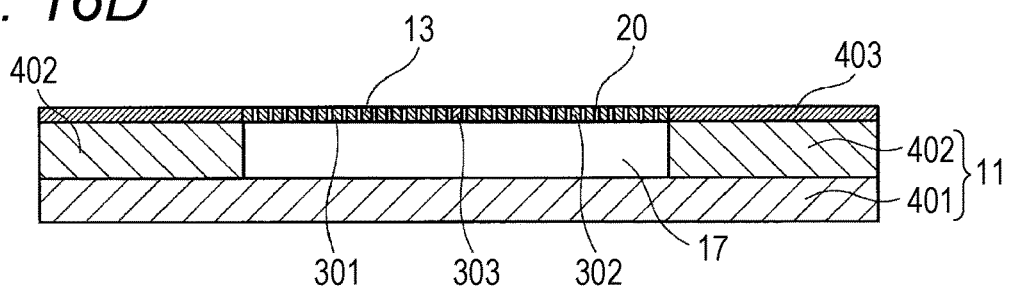
FIG. 16D is a sectional view schematically illustrating the example of the method for manufacturing the infrared sensor of the first embodiment.

Next, the part changed into the above-mentioned shape in beam layer 403 undergoes doping, whereby first region 301, second region 302, and junction region 303 are formed as illustrated in FIG. 16D. A part to be changed into first region 301 is, for example, p-doped, while a part to be changed into second region 302 is, for example, n-doped. For subsequent formation of wirings 15A and 15B, the doping may be expanded to overlap base substrate 11 in a plan view.

Figure 16E:
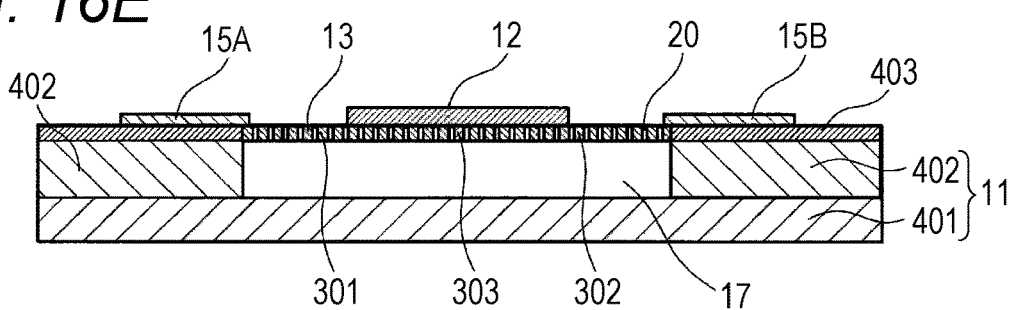
FIG. 16E is a sectional view schematically illustrating the example of the method for manufacturing the infrared sensor of the first embodiment.

Next, infrared receiver 12A is formed on the upper surface of beam 13 so as to touch junction region 303 as illustrated in FIG. 16E. Moreover, first wiring 15A and second wiring 15B are formed to be electrically connected to first region 301 and second region 302, respectively. Wirings 15A and 15B can be formed by, for example, photolithography and sputtering. Subsequently, signal processing circuits 14A and 14B are formed on base substrate 11. Furthermore, necessary electrical connections are secured, and thus, infrared sensor 1A of the first embodiment is obtained. Infrared receiver 12A and signal processing circuits 14A and 14B can each be formed by a publicly known technique.

Infrared sensor 1A of FIG. 1A functions as an independent infrared sensor in principle. Base substrate 11 may have an arrangement of a plurality of infrared sensors 1A that serve as individual pixels. An array structure in which the plurality of infrared sensors 1A are arranged is capable of, for example, at least one of imaging of an object with an infinite temperature or evaluation of infrared radiation intensity distribution or laser beam intensity distribution.

Second Embodiment

Figure 17A:
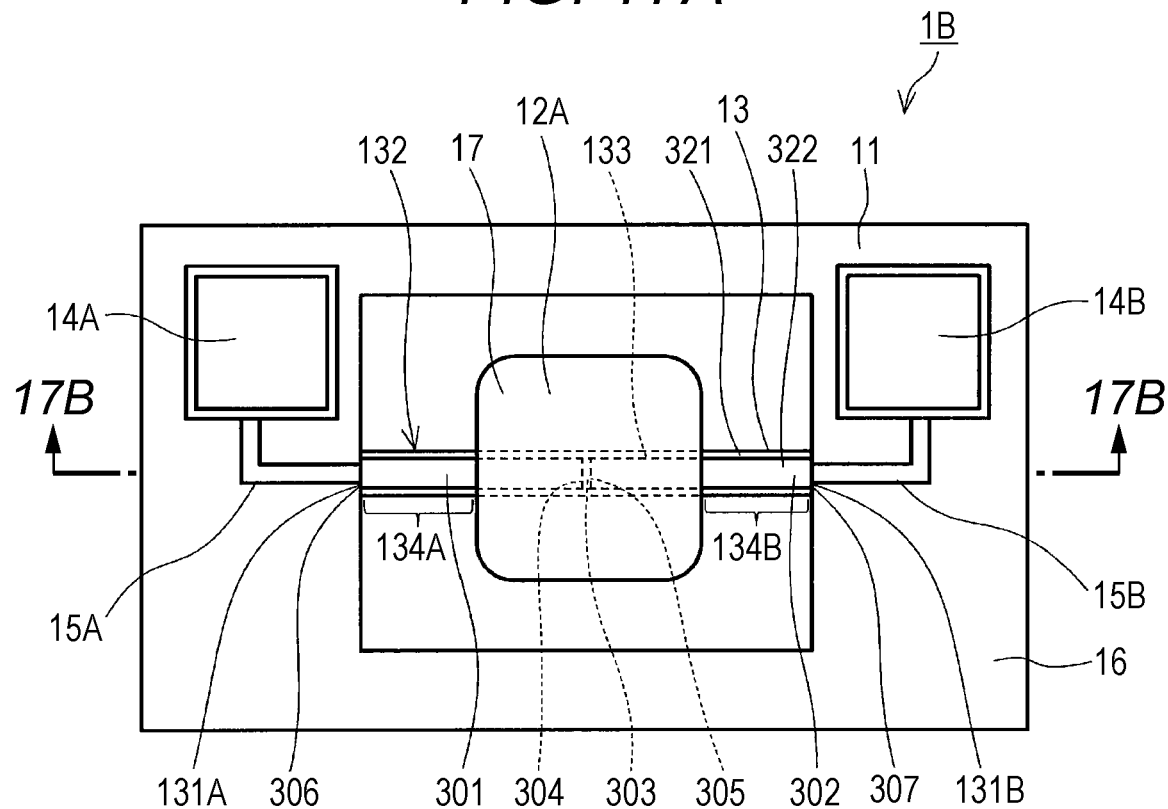
FIG. 17A is a plan view schematically illustrating an infrared sensor according to a second embodiment.
Figure 17B:
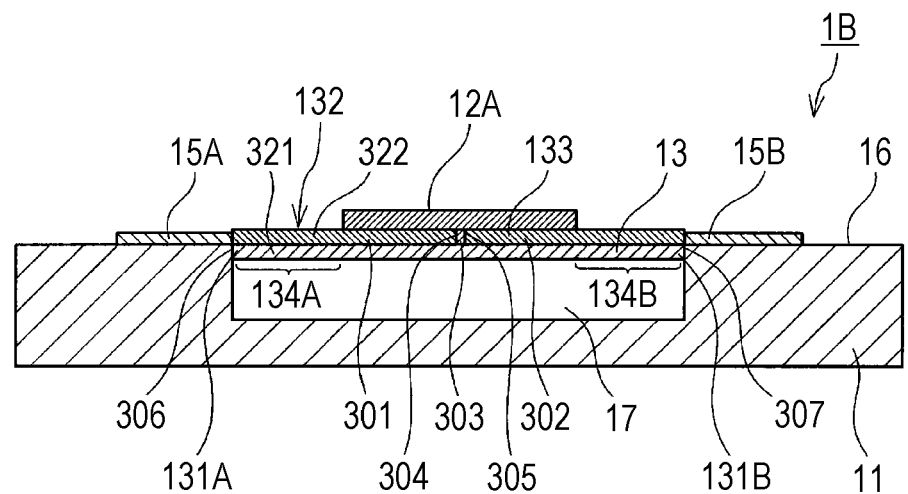
FIG. 17B illustrates section 17B-17B of the FIG. 17A infrared sensor.

FIGS. 17A and 17B illustrate an infrared sensor according to the second embodiment. FIG. 17B illustrates section 17B-17B of infrared sensor 1B of FIG. 17A. Infrared sensor 1B of FIGS. 17A and 17B is a thermopile infrared sensor.

Beam 13 of infrared sensor 1B includes base layer 321 and thermocouple layer 322 disposed on base layer 321. Beam 13 has a structure in which base layer 321 and thermocouple layer 322 are laminated together. Thermocouple layer 322 includes first region 301 having a first Seebeck coefficient, second region 302 having a second Seebeck coefficient that is different from the first Seebeck coefficient, and junction region 303 in which first region 301 and second region 302 are joined with each other. First region 301 and second region 302 are joined with each other at their respective one ends 304 and 305. First and second regions 301 and 302 joined with each other by junction region 303 compose a thermocouple element. In a plan view, junction region 303 is positioned to be overlapped by infrared sensor 1B. In the plan view, junction region 303 is positioned, for example, in a center of infrared sensor 1B. Infrared receiver 12A and junction region 303 of beam 13 are joined with each other. In this configuration, amorphous Si, for example, can be employed as base layer 321. As a material, the amorphous Si has a low thermal conductivity. This configuration thus takes into consideration further improvement of infrared responsivity.

The other structures of infrared sensor 1B according to the second embodiment, including preferable configurations, are similar to corresponding structures of infrared sensor 1A according to the first embodiment. Infrared sensor 1B of the second embodiment has the same working principle as infrared sensor 1A of the first embodiment.

The method for manufacturing infrared sensor 1A of the first embodiment can be applied to manufacture of infrared sensor 1B of the second embodiment.

Third Embodiment

Figure 18A:
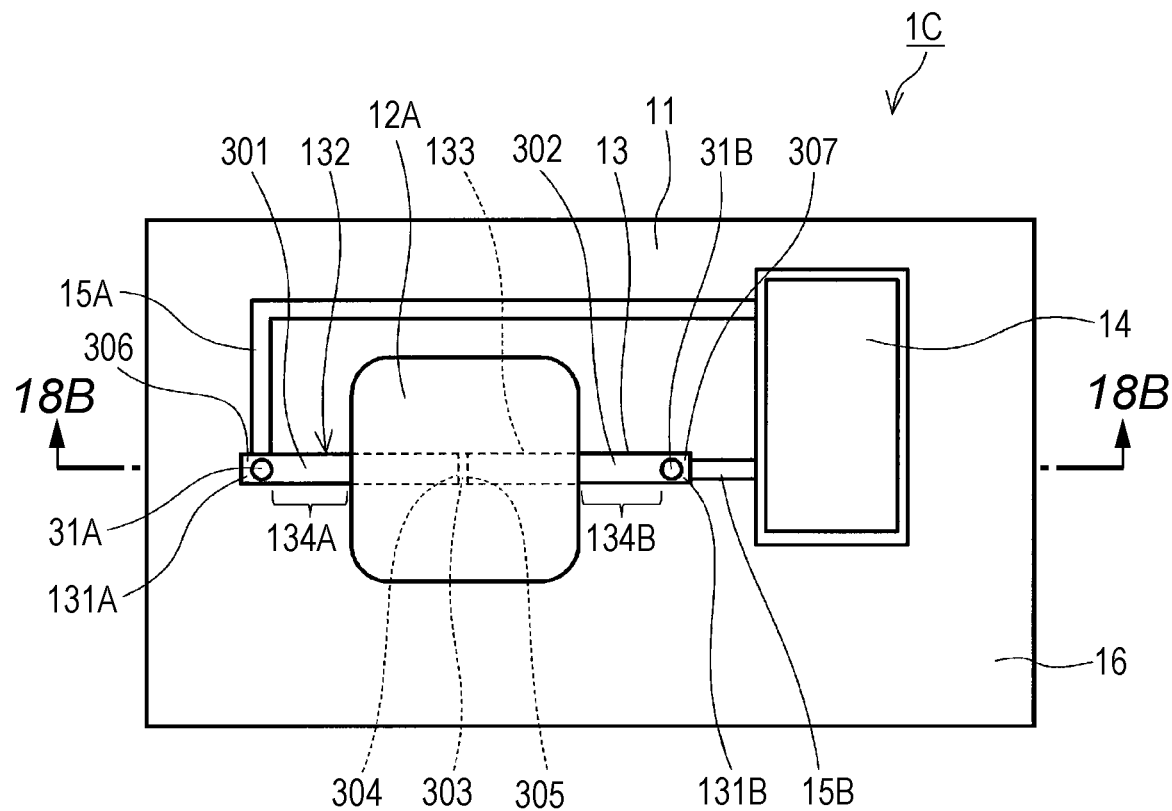
FIG. 18A is a plan view schematically illustrating an infrared sensor according to a third embodiment.
Figure 18B:
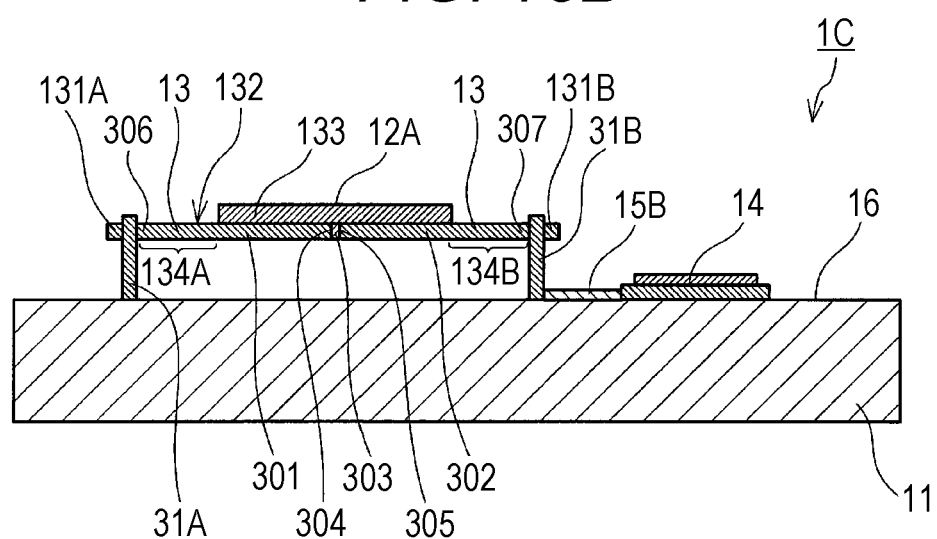
FIG. 18B illustrates section 18B-18B of the FIG. 18A infrared sensor.

FIGS. 18A and 18B illustrate an infrared sensor according to the third embodiment. FIG. 18B illustrates section 18B-18B of the infrared sensor of FIG. 18A. Infrared sensor 1C of FIGS. 18A and 18B is a thermopile infrared sensor.

Infrared sensor 1C includes first support 31A and second support 31B that are disposed on upper surface 16 of base substrate 11. First and second supports 31A and 31B extend in a direction away from upper surface 16 of base substrate 11. Beam 13 includes connective portion 131A connecting with first support 31A, and connective portion 131B connecting with second support 31B. Beam 13 also includes separated portion 132 separated from base substrate 11. Beam 13 has those connective portions 131A and 131B at its both ends, respectively. Infrared receiver 12A and beam 13 are joined with each other at separated portion 132. Infrared receiver 12A is joined to an upper surface of beam 13. Infrared receiver 12A and beam 13 are joined with each other between the ends of beam 13, or more specifically, around a center of beam 13. Infrared receiver 12A is supported by beam 13 including separated portion 132 in a state where the infrared receiver 12A is separated from base substrate 11. In a sectional view, infrared receiver 12A and beam 13 are suspended above base substrate 11 by supports 31A and 31B. Beam 13 is a double-supported beam. This configuration enables a proportion of an area of infrared receiver 12A to an area of infrared sensor 1C to be increased in a plan view. This proportion is known as a fill factor to those skilled in the art.

First region 301 and first wiring 15A are electrically connected via first support 31A. Second region 302 and second wiring 15B are electrically connected via second support 31B.

First and second supports 31A and 31B are each composed of an electrically conductive material. The electrically conductive material is, for example, a metal. Examples of the metal that composes each of first and second supports 31A and 31B include Cu and Al. However, the material composing each of first and second supports 31A and 31B is not limited to the above examples.

Infrared sensor 1C may also include an infrared reflecting film on upper surface 16 of base substrate 11. This configuration enables enhanced responsivity of infrared sensor 1C. Examples of a material for the infrared reflecting film include Al and Au. However, the material for the infrared reflecting film is not limited to the above examples.

The other structures of infrared sensor 1C according to the third embodiment, including preferable configurations, are similar to corresponding structures of infrared sensor 1A according to the first embodiment. Infrared sensor 1C of the third embodiment has the same working principle as infrared sensor 1A of the first embodiment.

A description is hereinafter provided of an example of a method for manufacturing infrared sensor 1C of the third embodiment. FIG. 18A infrared sensor 1C is manufactured according to the method described below. FIGS. 19A to 19D, which are used in the following description, illustrate sections corresponding to section 18B-18B of infrared sensor 1C of FIG. 18A. The method for manufacturing infrared sensor 1C is not limited to the following example.

Figure 19A:
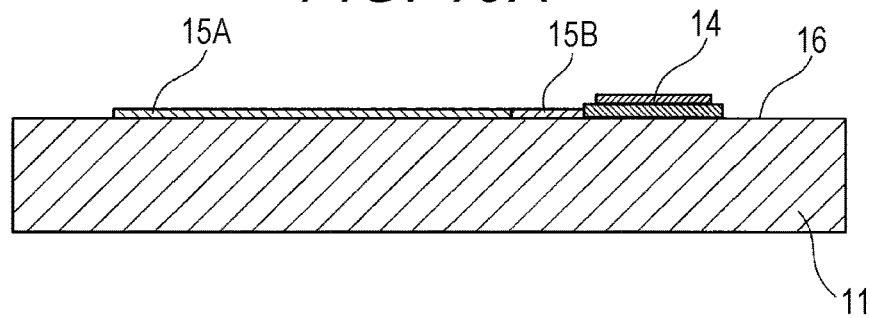
FIG. 19A is a sectional view schematically illustrating an example of a method for manufacturing the infrared sensor of the third embodiment.

Base substrate 11 is prepared first. Next, signal processing circuit 14, wiring 15A, and wiring 15B are formed on upper surface 16 of base substrate 11 (FIG. 19A). What can be used for forming signal processing circuit 14 and wirings 15A and 15B is a publicly known method that includes a thin film formation technique such as a sputtering method or a vapor deposition method and a pattern formation technique such as a photolithographic method. The infrared reflecting film may be formed on upper surface 16 of base substrate 11 along with signal processing circuit 14 and wirings 15A and 15B.

Figure 19B:
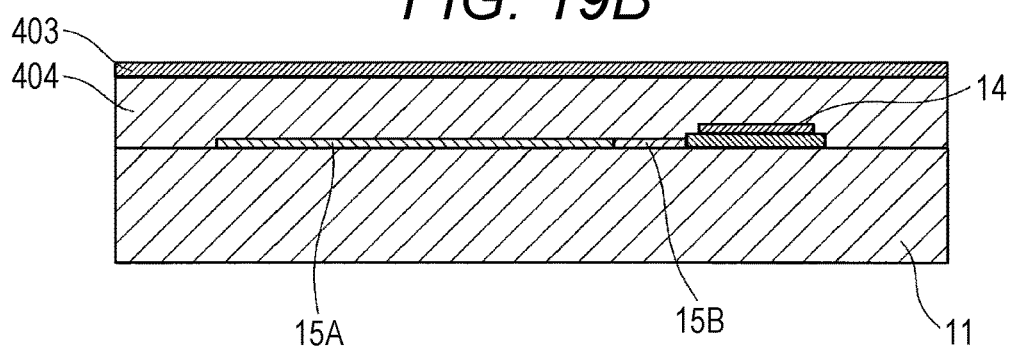
FIG. 19B is a sectional view schematically illustrating the example of the method for manufacturing the infrared sensor of the third embodiment.
Figure 19C:
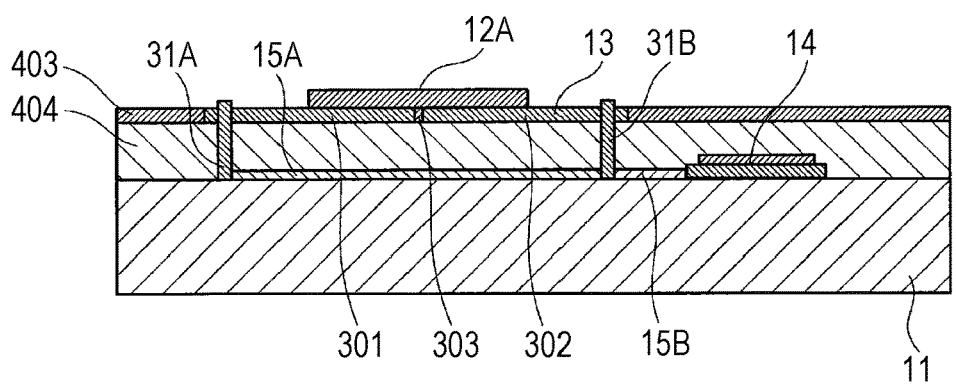
FIG. 19C is a sectional view schematically illustrating the example of the method for manufacturing the infrared sensor of the third embodiment.
Figure 19D:
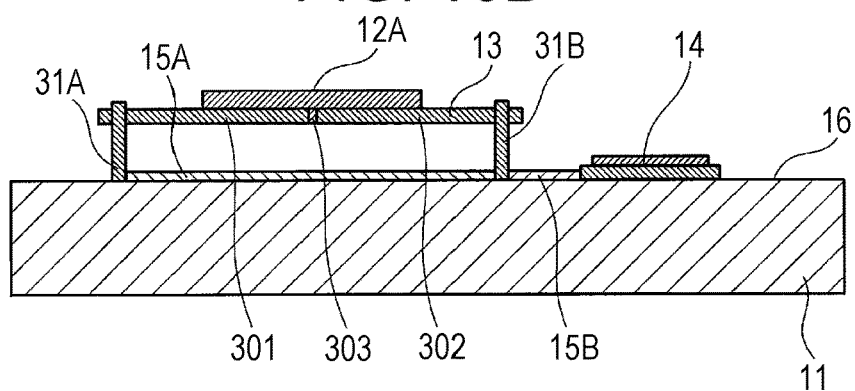
FIG. 19D is a sectional view schematically illustrating the example of the method for manufacturing the infrared sensor of the third embodiment.

Next, as illustrated in FIG. 19B, sacrificial layer 404 and beam layer 403 are sequentially formed on upper surface 16 of base substrate 11. Sacrificial layer 404 can be formed to cover signal processing circuit 14 and wirings 15A and 15B. Sacrificial layer 404 is typically composed of a resin. A selectable thickness of sacrificial layer 404 corresponds with a clearance between beam 13 and base substrate 11 in infrared sensor 1C to be manufactured. The resin is, for example, polyimide. Sacrificial layer 404 can be formed by, for example, a publicly known thin film formation technique such as CVD, a sputtering method, or a spin coating method. A material for beam layer 403 is what has been stated above. Beam layer 403 has a thickness ranging, for example, from not less than 10 nm and not more than 500 nm. Subsequently, a plurality of through holes 20 are formed in beam layer 403 to be arranged orderly in a plan view. FIG. 19B and FIGS. 19C and 19D that are described later, however, do not illustrate those through holes 20. A method for forming through holes 20 is what has been stated above.

Next, first region 301, second region 302, junction region 303, first support 31A, second support 31B, and infrared receiver 12A are formed as illustrated in FIG. 19C. Photolithography, selective etching, and doping that have been stated above can be used for forming first region 301, second region 302, and junction region 303. For formation of first and second supports 31A and 31B, selective etching that secures spaces for supports 31A and 31B, and a thin film formation technique that effects formation of supports 31A and 31B in the respective secured spaces, such as a sputtering method or a vapor deposition method, can be used. Infrared receiver 12A can be formed by a publicly known technique.

Next, as illustrated in FIG. 19D, sacrificial layer 404 is removed by selective etching, and thus, infrared sensor 1C of the third embodiment is obtained.

Fourth Embodiment

Figure 20:
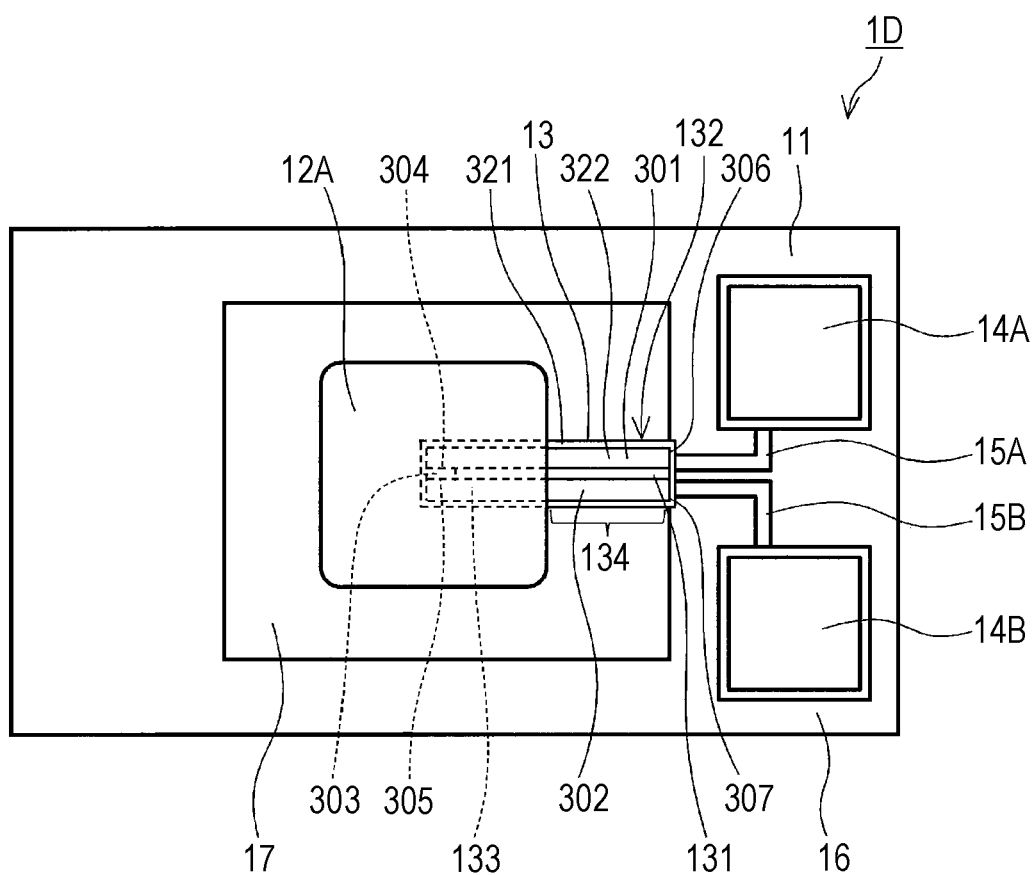
FIG. 20 is a plan view schematically illustrating an infrared sensor according to a fourth embodiment.

FIG. 20 illustrates an infrared sensor according to the fourth embodiment. FIG. 20 infrared sensor 1D is a thermopile infrared sensor.

Beam 13 includes connective portion 131 connecting with base substrate 11, and separated portion 132 separated from base substrate 11. Beam 13 has this connective portion 131 at its one end. Infrared receiver 12A and beam 13 are joined with each other at separated portion 132. More specifically, another end of beam 13 is where infrared receiver 12A and beam 13 are connected and is positioned at separated portion 132. Infrared receiver 12A is supported by beam 13 including separated portion 132 in a state where the infrared receiver 12A is separated from base substrate 11. Beam 13 is a cantilever beam.

Base substrate 11 includes recess 17 in upper surface 16 where infrared receiver 12A is provided. Recess 17 is positioned between base substrate 11 and infrared receiver 12A with beam 13. In a sectional view, infrared receiver 12A and beam 13 are suspended above recess 17 of base substrate 11.

Beam 13 includes base layer 321 and thermocouple layer 322 disposed on base layer 321. Thermocouple layer 322 includes first region 301 having a first Seebeck coefficient, second region 302 having a second Seebeck coefficient that is different from the first Seebeck coefficient, and junction region 303 in which first region 301 and second region 302 are joined with each other. First region 301 and second region 302 are joined with each other at their respective one ends 304 and 305. First and second regions 301 and 302 joined with each other by junction region 303 compose a thermocouple element. Infrared receiver 12A and junction region 303 of beam 13 are joined with each other.

First wiring 15A is electrically connected to first region 301 at another end 306 of first region 301. End 306 is positioned at connective portion 131 of beam 13. Second wiring 15B is electrically connected to second region 302 at another end 307 of second region 302. End 307 is positioned at connective portion 131 of beam 13. First wiring 15A electrically connects first region 301 of beam 13 and first signal processing circuit 14A. Second wiring 15B electrically connects second region 302 of beam 13 and second signal processing circuit 14B.

Beam 13 includes junction part 133 joined to infrared receiver 12A, and section 134 positioned between junction part 133 and connective portion 131 that connects with base substrate 11 and first and second wirings 15A and 15B. Section 134 includes phononic crystal structure A.

The other structures of infrared sensor 1D according to the fourth embodiment, including preferable configurations, are similar to corresponding structures of infrared sensor 1A according to the first embodiment. Infrared sensor 1D of the fourth embodiment has the same working principle as infrared sensor 1A of the first embodiment.

The method for manufacturing infrared sensor 1A of the first embodiment can be applied to manufacture of infrared sensor 1D of the fourth embodiment.

Fifth Embodiment

Figure 21A:
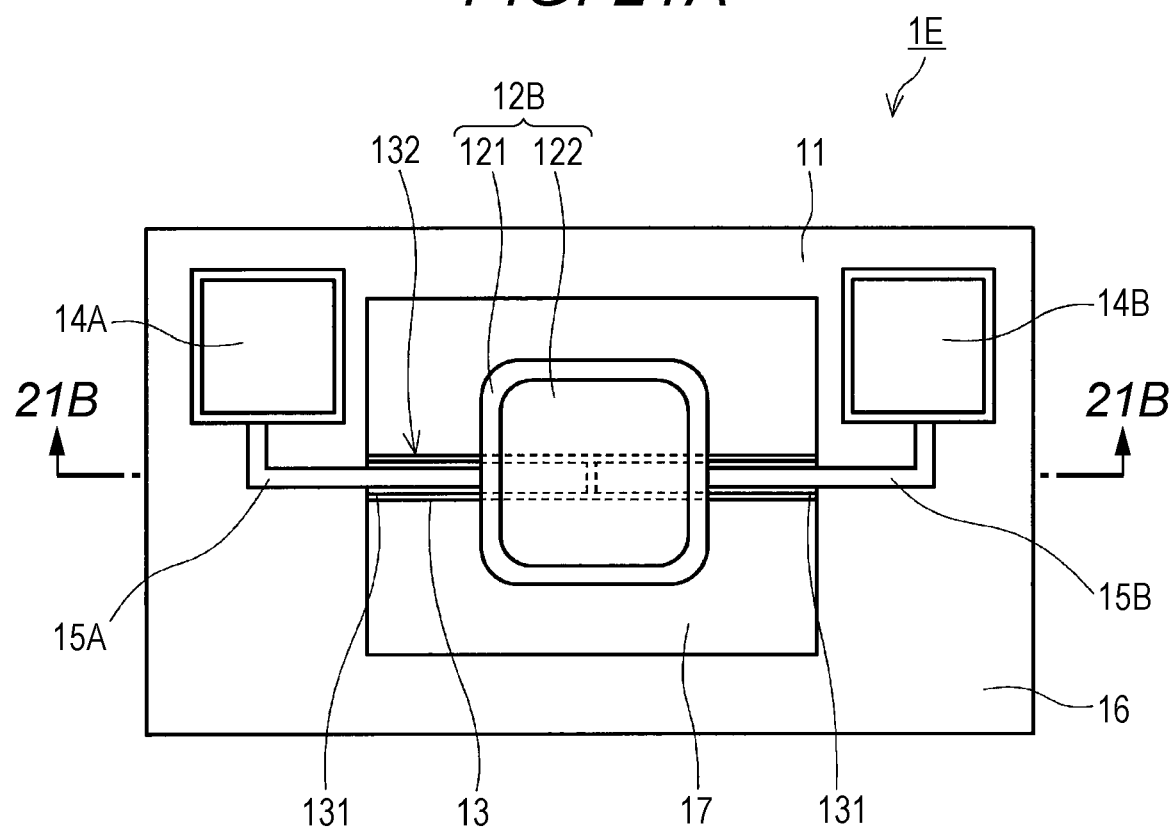
FIG. 21A is a plan view schematically illustrating an infrared sensor according to a fifth embodiment.
Figure 21B:
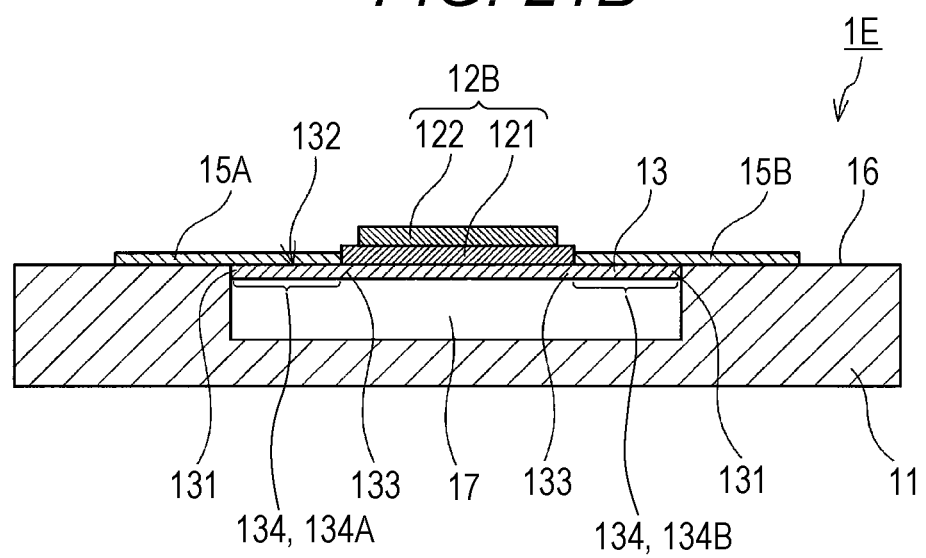
FIG. 21B illustrates section 21B-21B of the infrared sensor of FIG. 21A.

FIGS. 21A and 21B illustrate an infrared sensor according to the fifth embodiment. FIG. 21B illustrates section 21B-21B of infrared sensor 1E of FIG. 21A. Infrared sensor 1E of FIGS. 21A and 21B is a bolometer infrared sensor. Infrared sensor 1E includes base substrate 11, bolometer infrared receiver 12B, and beam 13. Infrared sensor 1E also includes first signal processing circuit 14A, second signal processing circuit 14B, first wiring 15A, and second wiring 15B. Signal processing circuits 14A and 14B are provided on base substrate 11. Wirings 15A and 15B are provided on base substrate 11 and beam 13.

Beam 13 includes connective portions 131 connecting with base substrate 11, and separated portion 132 separated from base substrate 11. Beam 13 has those connective portions 131 at its both ends, respectively. Infrared receiver 12B and beam 13 are joined with each other at separated portion 132. Infrared receiver 12B is joined to an upper surface of beam 13. Infrared receiver 12B and beam 13 are joined with each other between the ends of beam 13, or more specifically, around a center of beam 13. Infrared receiver 12B is supported by beam 13 including separated portion 132 in a state where the infrared receiver 12B is separated from base substrate 11. Beam 13 is a double-supported beam.

Base substrate 11 includes recess 17 in upper surface 16 where infrared receiver 12B is provided. In a plan view, recess 17 has a larger area than infrared receiver 12B. In the plan view, infrared receiver 12B is surrounded by an outer edge of recess 17. Recess 17 is positioned between base substrate 11 and infrared receiver 12B with beam 13. In a sectional view, infrared receiver 12B and beam 13 are suspended above recess 17 of base substrate 11. The ends of beam 13 are both connected to a side wall of recess 17.

First and second wirings 15A and 15B are electrically connected to infrared receiver 12B. First wiring 15A is electrically connected to first signal processing circuit 14A. Second wiring 15B is electrically connected to second signal processing circuit 14B.

Beam 13 includes junction part 133 joined to infrared receiver 12B, and sections 134 (134A and 134B) each positioned between junction part 133 and connective portion 131 that connects with base substrate 11. Sections 134 (134A and 134B) each include phononic crystal structure A. If beam 13 includes a plurality of sections 134, phononic crystal structure A is included, for example, in every one of the sections.

When infrared light is incident on infrared receiver 12B, infrared receiver 12B experiences temperature increase. The temperature increase that infrared receiver 12B experiences here becomes greater with increasing thermal insulation from base substrate 11 which is a heat bath as well as from those members on base substrate 11. Associated with the temperature increase, a change of electrical resistance takes place in bolometer infrared receiver 12B. The resulting electrical resistance change is processed by signal processing circuits 14A and 14B, whereby the infrared light is detected. Depending on signal processing, infrared sensor 1E is capable of infrared intensity measurement and/or object temperature measurement.

In infrared sensor 1E of FIGS. 21A and 21B, first and second wirings 15A and 15B each include a section separated from base substrate 11. First wiring 15A has the section positioned in between a part connecting with infrared receiver 12B and first signal processing circuit 14A. Second wiring 15B has the section positioned in between a part connecting with infrared receiver 12B and second signal processing circuit 14B. The respective sections of first and second wirings 15A and 15B touch the surface of beam 13. Beam 13 may partly include the respective sections of first and second wirings 15A and 15B as its regions. Each of these partial regions of beam 13 can be composed of, for example, a doped semiconductor to form such a section.

In the fifth embodiment, first wiring 15A and/or second wiring 15B may include phononic crystal structure A. In such a configuration, heat conduction via first wiring 15A and/or second wiring 15B is suppressed. Accordingly, responsivity of infrared sensor 1E can improve further.

In cases where first wiring 15A and/or second wiring 15B includes phononic crystal structure A, respective phononic crystal structures A of beam 13 and first wiring 15A may be defined by a common plurality of through holes. Also, respective phononic crystal structures A of beam 13 and second wiring 15B may be defined by a common plurality of through holes. Such a configuration can further improve the responsivity of infrared sensor 1E. Such a configuration also has excellent manufacturability because beam 13, first wiring 15A, and second wiring 15B can have their respective phononic crystal structures A formed at the same time.

Infrared receiver 12B typically includes a stacking structure of variable resistance layer 121 and infrared absorbing layer 122 which has been provided on the variable resistance layer 121. Infrared absorbing layer 122 is normally positioned as an external layer of infrared receiver 12B.

Variable resistance layer 121 is composed of a material that exhibits a large temperature-dependent electrical resistance change. Examples of the material for variable resistance layer 121 include Pt, amorphous Si, and vanadium oxide. These materials each have a high temperature coefficient of resistance. However, the material for variable resistance layer 121 is not limited to the above examples.

Infrared absorbing layer 122 is composed of, for example, a metal such as Ti, Cr, Au, Al, or Cu, an oxide such as $SiO_2$, and a nitride such as TiN or SiN. However, the material for infrared absorbing layer 122 is not limited to the above example. If infrared absorbing layer 122 is electrically conductive, infrared receiver 12B normally includes an insulating layer between variable resistance layer 121 and infrared absorbing layer 122.

The other structures of infrared sensor 1E according to the fifth embodiment, including preferable configurations, are similar to corresponding structures of infrared sensor 1A according to the first embodiment.

Infrared sensor 1E of the fifth embodiment can be manufactured by means of publicly known techniques that include a thin film formation technique such as a sputtering method or a vapor deposition method, and a microfabrication technique such as a photolithographic method or a selective etching method. The above-stated method for manufacturing infrared sensor 1A of the first embodiment can also be applied to manufacture of infrared sensor 1E.

Sixth Embodiment

Figure 22A:
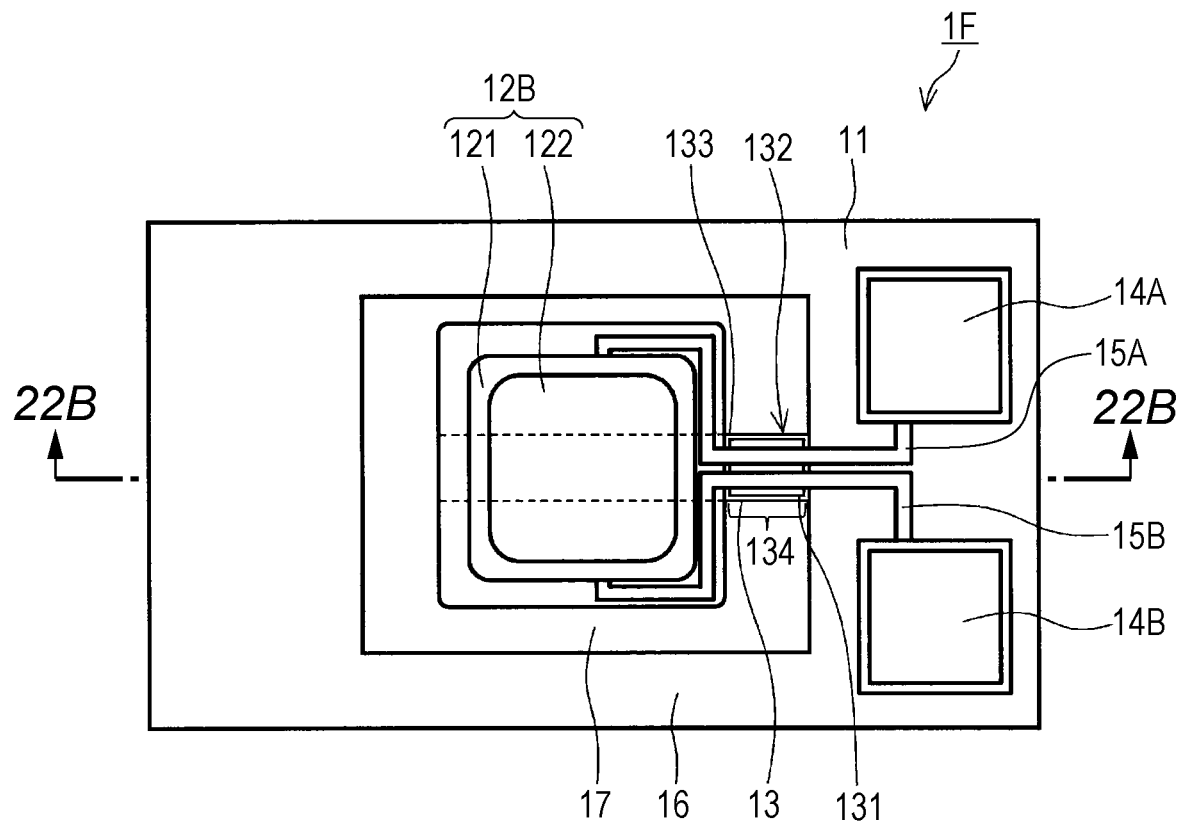
FIG. 22A is a plan view schematically illustrating an infrared sensor according to a sixth embodiment.
Figure 22B:
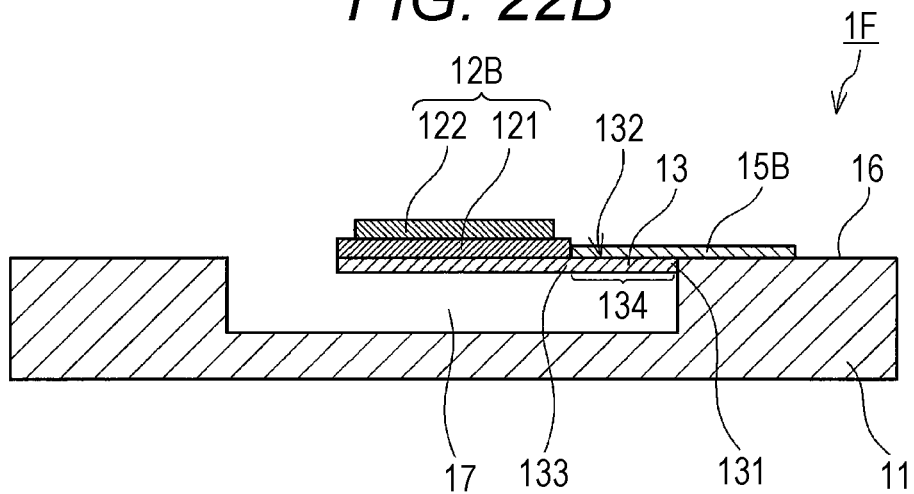
FIG. 22B illustrates section 22B-22B of the infrared sensor of FIG. 22A.

FIGS. 22A and 22B illustrate an infrared sensor according to the sixth embodiment. FIG. 22B illustrates section 22B-22B of infrared sensor 1F of FIG. 22A. Infrared sensor 1F of FIGS. 22A and 22B is a bolometer infrared sensor.

Beam 13 includes connective portions 131 connecting with base substrate 11, and separated portion 132 separated from base substrate 11. Beam 13 has this connective portion 131 at its one end. Infrared receiver 12B and beam 13 are joined each other at separated portion 132. More specifically, another end of beam 13 is where infrared receiver 12B and beam 13 are connected and is positioned at separated portion 132. Infrared receiver 12B is supported by beam 13 including separated portion 132 in a state where the infrared receiver 12B is separated from base substrate 11. Beam 13 is a cantilever beam.

Base substrate 11 includes recess 17 in upper surface 16 where infrared receiver 12B is provided. Recess 17 is positioned between base substrate 11 and infrared receiver 12B with beam 13. In a sectional view, infrared receiver 12B and beam 13 are suspended above recess 17 of base substrate 11.

First wiring 15A and second wiring 15B are electrically connected to infrared receiver 12B. First wiring 15A is electrically connected to first signal processing circuit 14A. Second wiring 15B is electrically connected to second signal processing circuit 14B.

Beam 13 includes junction part 133 joined to infrared receiver 12B, and section 134 positioned between junction part 133 and connective portion 131 that connects with base substrate 11. Section 134 includes phononic crystal structure A.

The other structures of infrared sensor 1F according to the sixth embodiment, including preferable configurations, are similar to corresponding structures of infrared sensor 1E according to the fifth embodiment. Infrared sensor 1F of the sixth embodiment has the same working principle as infrared sensor 1E of the fifth embodiment.

Infrared sensor 1F of the sixth embodiment can be manufactured by means of publicly known techniques that include a thin film formation technique such as a sputtering method or a vapor deposition method, and a microfabrication technique such as a photolithographic method or a selective etching method. The above-stated method for manufacturing infrared sensor 1A of the first embodiment can also be applied to manufacture of infrared sensor 1F.

Seventh Embodiment

Figure 23A:
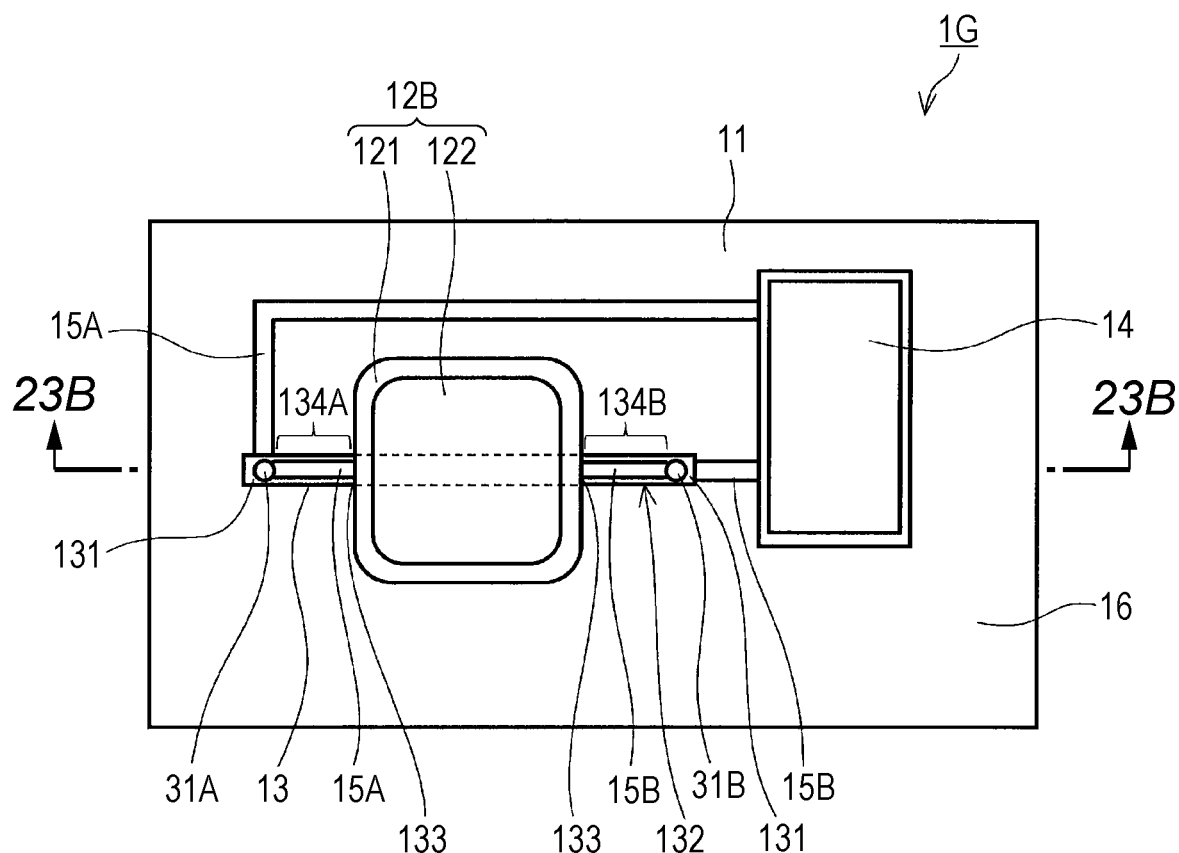
FIG. 23A is a plan view schematically illustrating an infrared sensor according to a seventh embodiment.
Figure 23B:
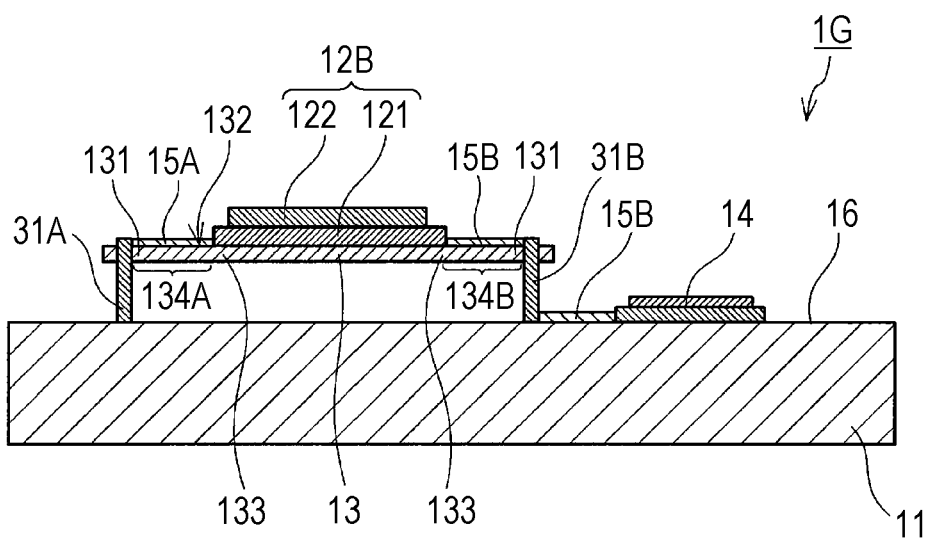
FIG. 23B illustrates section 23B-23B of the infrared sensor of FIG. 23A.

FIGS. 23A and 23B illustrate an infrared sensor according to the seventh embodiment. FIG. 23B illustrates section 23B-23B of infrared sensor 1G of FIG. 23A. Infrared sensor 1G of FIGS. 23A and 23B is a bolometer infrared sensor.

Infrared sensor 1G includes first support 31A and second support 31B that are disposed on upper surface 16 of base substrate 11. First and second supports 31A and 31B extend in a direction away from upper surface 16 of base substrate 11. Beam 13 includes connective portion 131A connecting with first support 31A, and connective portion 131B connecting with second support 31B. Beam 13 also includes separated portion 132 separated from base substrate 11. Beam 13 has those connective portions 131A and 131B at its both ends, respectively. Infrared receiver 12B and beam 13 are joined each other at separated portion 132. Infrared receiver 12B is joined to an upper surface of beam 13. Infrared receiver 12B and beam 13 are joined with each other between the ends of beam 13, or more specifically, around a center of beam 13. Infrared receiver 12B is supported by beam 13 including separated portion 132 in a state where the infrared receiver 12B is separated from base substrate 11. In a sectional view, infrared receiver 12B and beam 13 are suspended above base substrate 11 by supports 31A and 31B. Beam 13 is a double-supported beam.

First wiring 15A and second wiring 15B are electrically connected to infrared receiver 12B. First wiring 15A includes first support 31A as its part and is electrically connected to first signal processing circuit 14A. Second wiring 15B includes second support 31B as its part and is electrically connected to second signal processing circuit 14B.

Beam 13 includes junction part 133 joined to infrared receiver 12B, and sections 134A and 134B each positioned between junction part 133 and connective portion 131 that connects with base substrate 11. Sections 134A and 134B each include phononic crystal structure A. If beam 13 includes a plurality of sections 134 between junction part 133 and connective portion 131, phononic crystal structure A may be included in every one of the sections.

The other structures of infrared sensor 1G according to the seventh embodiment, including preferable configurations, are similar to corresponding structures of infrared sensor 1E according to the fifth embodiment. What composes each of first and second supports 31A and 31B is specifically the same as described above in the third embodiment. Infrared sensor 1G of the seventh embodiment has the same working principle as infrared sensor 1E of the fifth embodiment.

Infrared sensor 1G of the seventh embodiment can be manufactured by means of publicly known techniques that include a thin film formation technique such as a sputtering method or a vapor deposition method, and a microfabrication technique such as a photolithographic method or a selective etching method. The above-stated method for manufacturing infrared sensor 1C of the third embodiment can also be applied to manufacture of infrared sensor 1G.

Phononic Crystal

A phononic crystal according to the present disclosure is of phononic crystal structure A. The phononic crystal according to the present disclosure is a film-shaped body including a plurality of orderly arranged through holes. The film-shaped body has a thickness that typically ranges from not less than 10 nm and not more than 500 nm.

More specifically, the phononic crystal according to the present disclosure includes a first domain and a second domain that are phononic crystal domains, respectively. In a plan view of the phononic crystal, the first domain is defined by a plurality of through holes orderly arranged in a first direction. In the plan view of the phononic crystal, the second domain is defined by a plurality of through holes orderly arranged in a second direction that is different from the first direction.

The phononic crystal according to the present disclosure may have, for example, phononic crystal structure A illustrated in FIG. 2, 5, 7, 9, 10, 11, 13, or 14.

The phononic crystal according to the present disclosure has a low thermal conductivity in an in-plane direction. This means that the phononic crystal according to the present disclosure exhibits enhanced thermal insulation in the in-plane direction. The phononic crystal according to the present disclosure can be put to, for example, various uses each requiring enhanced thermal insulation in an in-plane direction.

INDUSTRIAL APPLICABILITY

An infrared sensor according to the present disclosure can be put to various uses including uses where a conventional infrared sensor is used.

REFERENCE SIGNS LIST 1A, 1B, 1C, 1D, 1E, 1F, 1G infrared sensor
11 base substrate
12A (thermopile) infrared receiver
12B (bolometer) infrared receiver
13 beam
14 signal processing circuit
14A first signal processing circuit
14B second signal processing circuit
15A first wiring
15B second wiring
16 upper surface
17 recess
20 through hole
21A first domain
21B second domain
22 phononic polycrystalline structure
23A, 23B orientation
25 interface
31A first support
31B second support
91, 91A, 91B unit lattice
92 area
93 area
121 variable resistance layer
122 infrared absorbing layer
131 connective portion
132 separated portion
133 junction part
134, 134A, 134B section
201 domain
202 domain
301 first region
302 second region
303 junction region
304 end
305 end 306 end
307 end
401 base substrate
402 insulating layer
403 beam layer
404 sacrificial layer

The invention claimed is:

1. An infrared sensor comprising:
a base substrate;
an infrared receiver; and
a beam,
wherein
the beam includes a connective portion connecting with the base substrate and/or a member on the base substrate, and a separated portion separated from the base substrate,
the infrared receiver and the beam are joined with each other at the separated portion,
the infrared receiver is supported by the beam including the separated portion in a state where the infrared receiver is separated from the base substrate,
the beam includes a junction part joined to the infrared receiver, and a section positioned between the junction part and the connective portion includes a phononic crystal structure defined by a plurality of through holes orderly arranged,
the phononic crystal structure includes a first domain and a second domain that are phononic crystal domains,
the first domain includes, in a plan view, the plurality of through holes arranged orderly in a first direction,
the second domain includes, in a plan view, the plurality of through holes arranged orderly in a second direction that is different from the first direction,
the infrared receiver is a thermopile infrared receiver or a bolometer infrared receiver,
if the infrared receiver is the thermopile infrared receiver,
the beam includes a first region having a first Seebeck coefficient, a second region having a second Seebeck coefficient that is different from the first Seebeck coefficient, and a junction region in which the first region and the second region are joined with each other, and
the infrared receiver and the junction region of the beam are joined with each other, and
if the infrared receiver is the bolometer infrared receiver, the infrared sensor further comprises:
a first wiring and a second wiring being both electrically connected to the infrared receiver;
a first signal processing circuit electrically connected to the first wiring; and
a second signal processing circuit electrically connected to the second wiring.

2. The infrared sensor according to claim 1, wherein:
the infrared receiver is the thermopile infrared receiver; and
the beam is a single layer.

3. The infrared sensor according to claim 1, wherein:
the infrared receiver is the thermopile infrared receiver;
the beam includes a base layer and a thermocouple layer disposed on the base layer; and
the thermocouple layer includes the first region, the second region, and the junction region.

4. The infrared sensor according to claim 1, wherein:
the infrared receiver is the thermopile infrared receiver; and
the infrared sensor further comprises:
a first wiring electrically connected to the first region;
a second wiring electrically connected to the second region;
a first signal processing circuit electrically connected to the first wiring; and
a second signal processing circuit electrically connected to the second wiring.

5. The infrared sensor according to claim 1, wherein:
the infrared receiver is the bolometer infrared receiver;
each of the first wiring and the second wiring includes a separated section separated from the base substrate in between a part connecting with the infrared receiver and corresponding one of the first signal processing circuit and the second signal processing circuit; and
the separated section of the first wiring and/or the separated section of the second wiring includes the phononic crystal structure.

6. The infrared sensor according to claim 1, wherein:
the infrared receiver is the bolometer infrared receiver;
each of the first wiring and the second wiring includes a separated section separated from the base substrate in between a part connecting with the infrared receiver and corresponding one of the first signal processing circuit and the second signal processing circuit; and
the separated section of the first wiring and/or the separated section of the second wiring is in contact with a surface of the beam.

7. The infrared sensor according to claim 6, wherein:
the separated section of the first wiring and/or the separated section of the second wiring includes the phononic crystal structure; and
the plurality of through holes of the phononic crystal structure of the beam are common to the phononic crystal structure of the first wiring and/or the phononic crystal structure of the second wiring.

8. The infrared sensor according to claim 1, wherein:
the beam includes the connective portion at each of two ends of the beam; and
the infrared receiver and the beam are joined with each other between the two ends of the beam.

9. The infrared sensor according to claim 1, wherein:
the beam includes the connective portion at one end of the beam; and
the infrared receiver and the beam are joined with each other at another end of the beam.

10. The infrared sensor according to claim 1, wherein:
the base substrate includes a recess;
the recess is positioned between the base substrate and the infrared receiver with the beam; and
the infrared receiver and the beam are suspended above the recess of the base substrate in a sectional view.

11. The infrared sensor according to claim 1, further comprising a support on the base substrate, the support extending in a direction away from an upper surface of the base substrate,
wherein the beam connects with the support at the connective portion, and
the infrared receiver and the beam are suspended above the base substrate by the support in a sectional view.

12. The infrared sensor according to claim 1, wherein a periodicity with which the plurality of through holes are arranged in the first domain is equal to a periodicity with which the plurality of through holes are arranged in the second domain.

13. The infrared sensor according to claim 1, wherein the plurality of through holes orderly arranged in the first domain are equal in diameter to the plurality of through holes orderly arranged in the second domain.

14. The infrared sensor according to claim 1, wherein unit lattices formed by the plurality of through holes orderly arranged in the first domain and unit lattices formed by the plurality of through holes orderly arranged in the second domain are identical in type.

15. The infrared sensor according to claim 1, wherein the first domain and the second domain are different in shape in a plan view.

16. The infrared sensor according to claim 1, wherein in a plan view, an interface between the first domain and the second domain that are adjacent to each other extends, in the section, in a direction inclined relative to a direction along a width of the beam.

17. The infrared sensor according to claim 1, wherein in a plan view, an interface between the first domain and the second domain that are adjacent to each other includes a bend.

18. The infrared sensor according to claim 1, wherein the first domain and/or the second domain of the phononic crystal structure does not border a side of the beam.

19. A phononic crystal having a phononic crystal structure, the phononic crystal comprising a first domain and a second domain that are phononic crystal domains,
  wherein the first domain is defined by a plurality of through holes arranged orderly in a first direction in a plan view, and
  the second domain is defined by a plurality of through holes orderly arranged, in a plan view, in a second direction that is different from the first direction.

* * * * *